United States Patent [19]
Teachout et al.

[11] Patent Number: 5,984,634
[45] Date of Patent: Nov. 16, 1999

[54] FAN ASSEMBLY FOR A PROCESSING UNIT CASE

[75] Inventors: Jeffrey Teachout, Upton; Nikolai Markovich, Hopkinton; Brian Gallagher, Marlboro, all of Mass.

[73] Assignee: EMC Corporation, Hopkinton, Mass.

[21] Appl. No.: 08/984,343

[22] Filed: Dec. 3, 1997

[51] Int. Cl.⁶ .................................................. F01D 25/28
[52] U.S. Cl. ..................... 415/213.1; 415/178; 361/695
[58] Field of Search ............................. 415/213.1, 214.1, 415/220, 223, 175, 176, 177, 178; 361/694, 695, 687

[56] References Cited

U.S. PATENT DOCUMENTS

| | | | |
|---|---|---|---|
| 4,751,872 | 6/1988 | Lawson, Jr. | 361/695 |
| 5,475,562 | 12/1995 | Gow | 361/695 |
| 5,528,454 | 6/1996 | Niklos | 361/695 |

*Primary Examiner*—F. Daniel Lopez
*Assistant Examiner*—Richard Woo
*Attorney, Agent, or Firm*—Fish & Richardson P.C.

[57] ABSTRACT

A cabinet having a plurality of compartments adapted to have disposed in a corresponding one thereof one of a plurality of processing unit modules. Each one of the modules includes a case. The case has a motherboard mounting surface adapted to have mounted thereto one of a plurality of differently configured motherboards, each one of the differently configured motherboards having a different arrangement of a CPU, main memory and I/O adapted cards. The case also has a bulkhead mounting surface adapted to have mounted thereto one of a plurality of differently configured I/O bulkheads, each one of the differently configured bulkheads being configured for a corresponding one of the differently configured motherboards. The case has a fan mounting surface adapted to have mounted thereto one of a plurality of differently configured fan assemblies, each one of the differently configured fan assemblies being configured for a corresponding one of the differently configured motherboards. The case is provided having a motherboard mounting surface adapted to have mounted thereto a CPU, main memory and an I/O adapter card. The I/O adapter card has a front lower edge adapted for plugging into the motherboard. A cover is adapted for mounting to the case over the motherboard. The cover has an anti-vibration member adapted to engage a rear upper edge of the I/O adapter card and maintain the I/O adapter card securely plugged into the motherboard when the cover is mounted to the case.

2 Claims, 35 Drawing Sheets

BACK VIEW

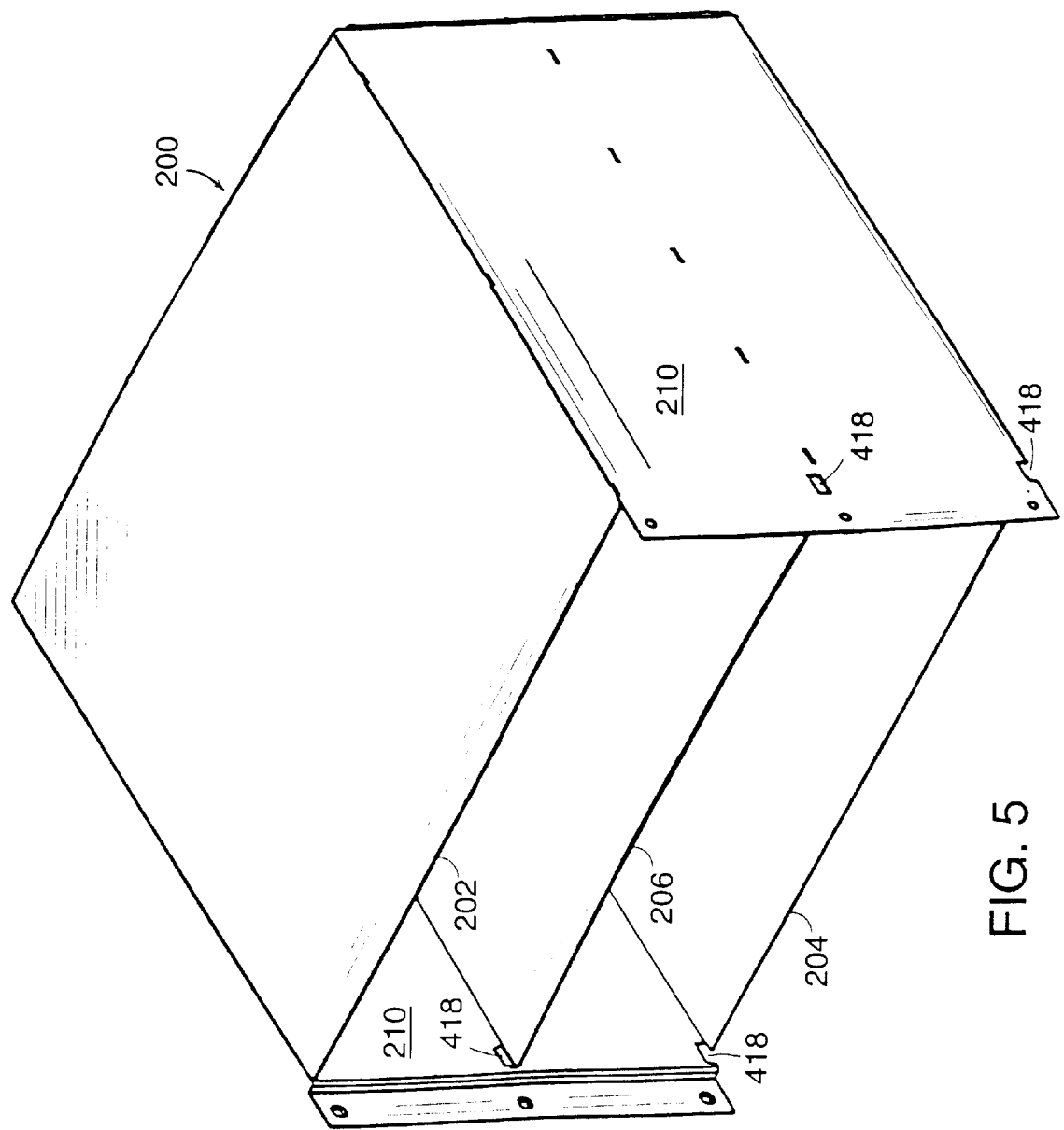

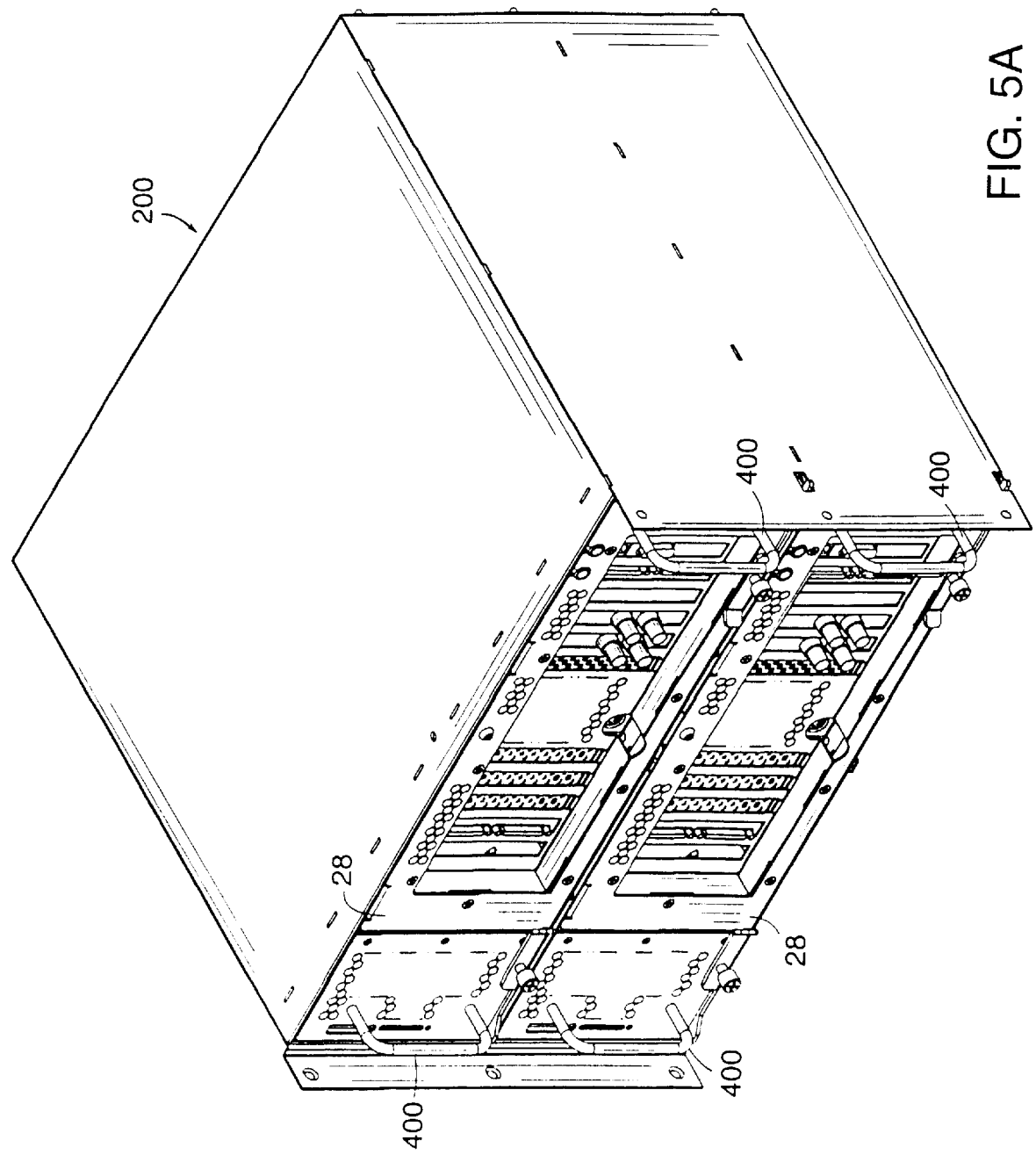

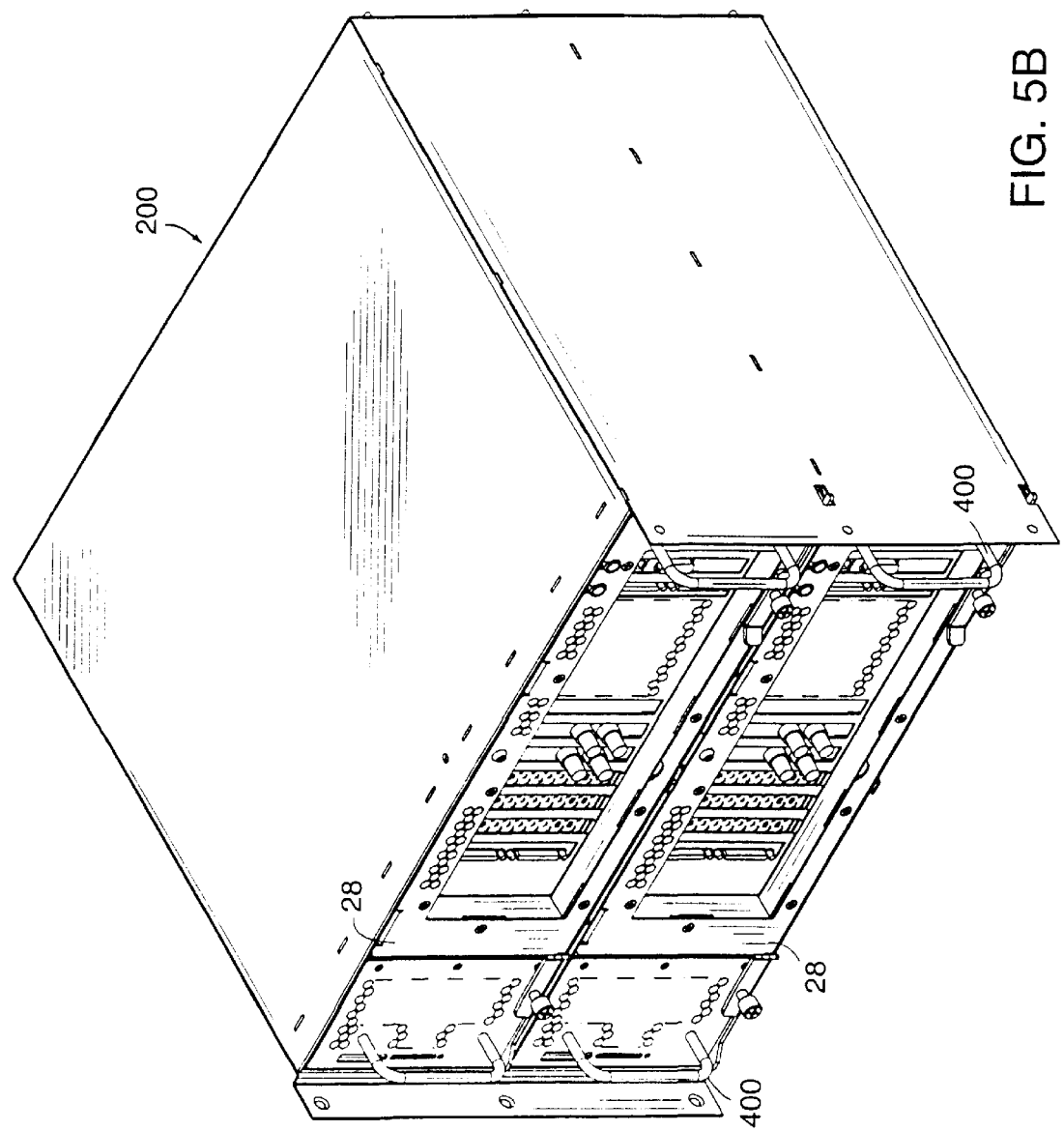

5,984,634

FAN ASSEMBLY FOR A PROCESSING UNIT CASE

BACKGROUND OF THE INVENTION

This invention relates generally to electrical storage cabinets and more particularly to electrical storage cabinets adapted to house a plurality of processing unit modules. The invention also relates to fan assemblies and covers for such cases.

As is known in the art, electrical storage cabinets have a wide range of applications. One such application is as a cabinet for a data server. Data servers are used to move data between a storage system, such as between a Symmetrix Integrated Cached Disk Array storage system and a network. The data server typically includes a set AC powered processing unit modules each of which includes a central processing unit (CPU), input/output (I/O) adapter cards, and a main memory programmed to run a variety of software application programs for subscribers to the network. These applications include file access, video access and/or network backup.

SUMMARY OF THE INVENTION

In accordance with the invention, a cabinet is provided with a plurality of compartments. Each one of the compartments is adapted to have disposed therein a corresponding one of a plurality of processing unit modules. Each one of the modules includes a case. The case has a motherboard mounting surface adapted to have mounted thereto one of a plurality of differently configured motherboards. Each one of the differently configured motherboards has a different arrangement of a CPU, main memory and I/O adapted cards. With such an arrangement, the case is a universal case which may be used for anyone of a repertoire of differently configured motherboards.

In accordance with another feature of the invention, the case also has a bulkhead mounting surface adapted to have mounted thereto one of a plurality of differently configured I/O adapter card bulkheads. Each one of the differently configured bulkheads is configured for a corresponding one of the differently configured motherboards.

With such an arrangement, the case may be used for one of a repertoire of different I/O adapter card bulkheads which is suitable for one of the motherboards mounted in the case.

In accordance with another feature of the invention, the case has a fan mounting surface adapted to have mounted thereto one of a plurality of differently configured fan assemblies. Each one of the differently configured fan assemblies is configured for a corresponding differently configured motherboard.

With such an arrangement, the case may be used for one of a repertoire of differently configured fan assemblies which is suitable to provide optimum air-flow cooling to one of the motherboards mounted in the case.

In accordance with another feature of the invention, a case is provided having a motherboard mounting surface adapted to have mounted thereto a CPU, main memory and I/O adapter cards. The I/O adapter cards have a front bottom edge adapted for plugging into the motherboard. A cover is adapted for mounting to the case over the motherboard. The cover has an anti-vibration member adapted to engage an upper rear edge of the I/O adapter cards and maintain the I/O adapter cards securely plugged into the motherboard.

With such an arrangement, the adapter cards are more securely plugged into the motherboard case.

In accordance with another feature of the invention, the case the I/O adapter cards have a front mounting bracket secured to a front portion of the case and the anti-vibration member engages the upper rear edge of the I/O adapter card when the cover is mounted to the case.

In accordance with another feature of the invention, the motherboard has a plurality of I/O adapter cards with front bottom edges thereof plugged into the motherboard, and the anti-vibration member is adapted to engage rear upper edges of the plurality of I/O adapter cards and maintain the I/O adapter cards securely plugged into the motherboard.

In accordance with still another feature of the invention a fan assembly is adapted for mounting to a case. The fan assembly includes a mounting plate having an aperture formed therethrough and adapted for affixing to the case with the aperture in registration with an aperture formed through a panel of the case. A fan is mounted to the mounting plate with the fan being disposed in registration with the aperture formed in the mounting plate.

BRIEF DESCRIPTION OF THE DRAWING

Other features of the invention, as well as the invention itself, will become more readily apparent from the following detailed description taken together with the accompanying drawings, in which:

FIG. 3C is a rear view of the cabinet when a rear door thereof is open.

FIG. 4A being a rear perspective view of the data server with the rear door open; and FIG. 4B being a front perspective view of the data server with the front door open;

FIG. 5 is a perspective view of a chassis used by the server of FIG. 2, four such chassis being shown in FIG. 3B, each one of such chassis being adapted to store up to two processing unit modules;

FIGS. 5A, 5B, and 5C are perspective drawings showing the chassis of FIG. 5 storing two processing modules; FIG. 5A showing an arrangement where both modules are of the same first type; FIG. 5B showing an arrangement where both modules are of the same second type; and FIG. 5C showing an arrangement where one of the two modules is the first type and the other one of the modules is the second type;

FIG. 6A showing an arrangement where both modules are of the same first type; FIG. 6B showing an arrangement where both modules are of the same second type; and FIG. 6C showing an arrangement where one of the two modules is the first type and the other one of the modules is the second type;

DESCRIPTION OF THE PREFERRED EMBODIMENTS

Figure 1:
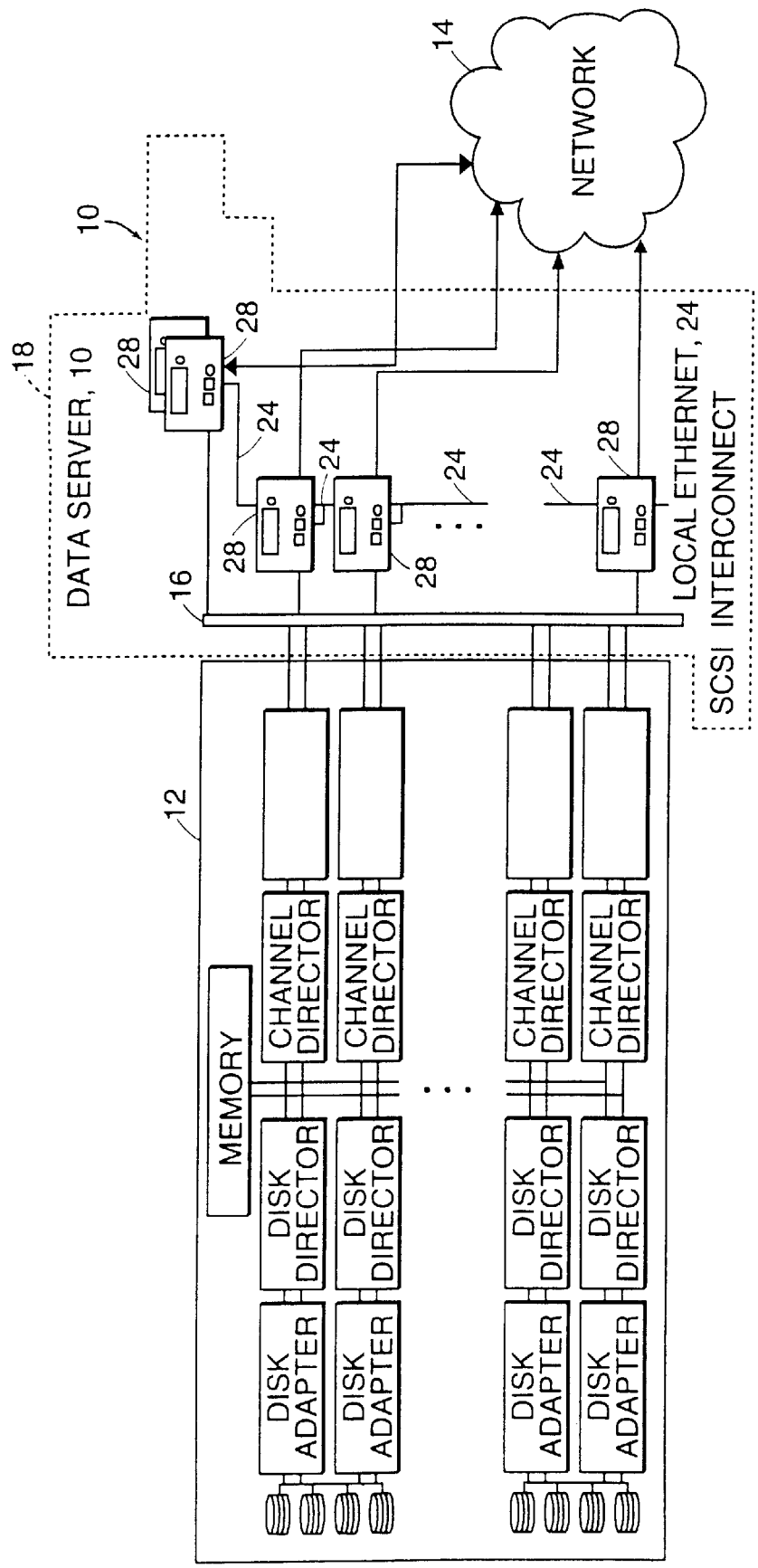
FIG. 1 is a diagram of a data server according to the invention coupled between a memory system and a network.
Figure 2:
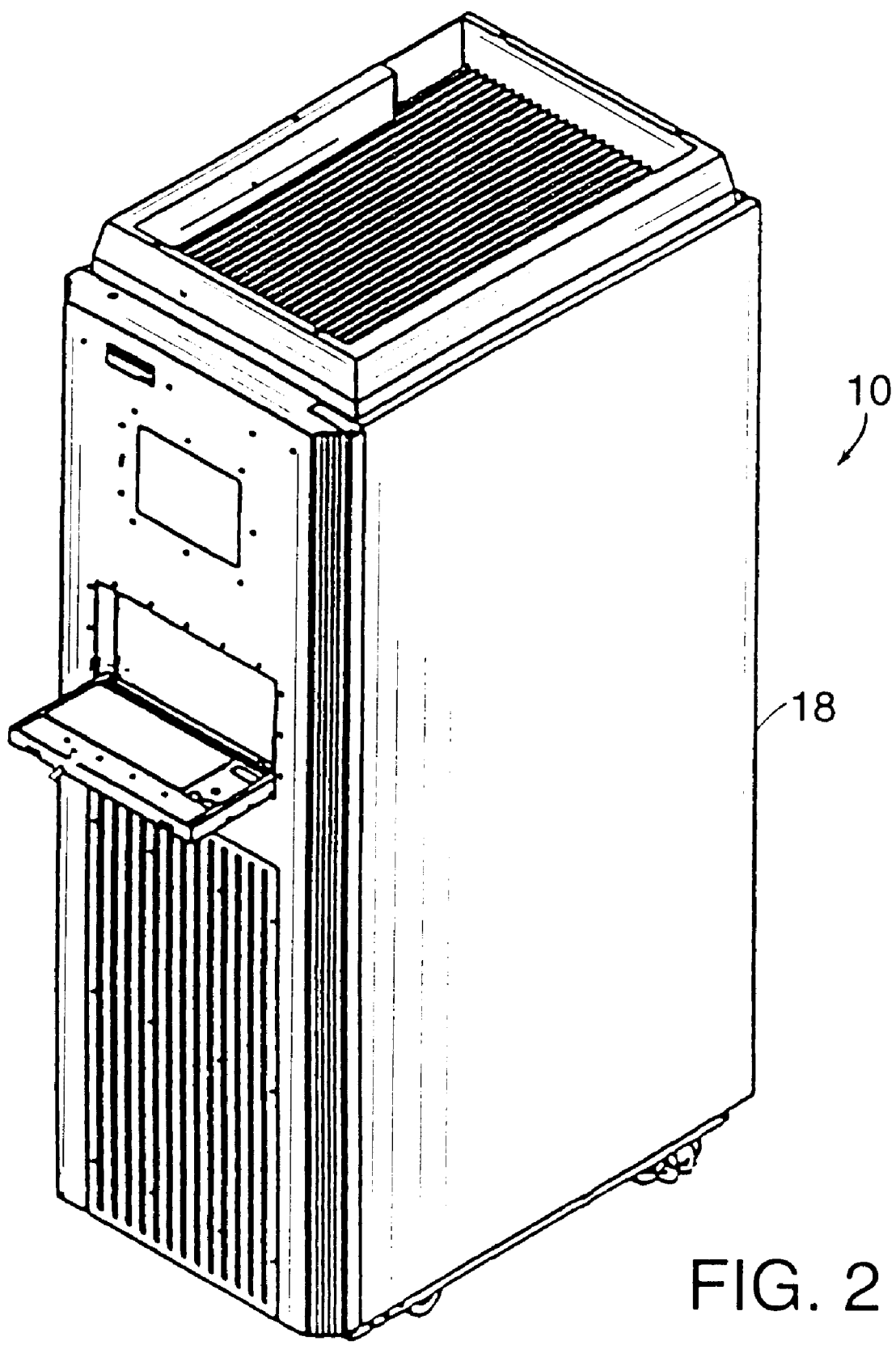
FIG. 2 is a drawing of the data server of FIG. 1.
Figure 3A:
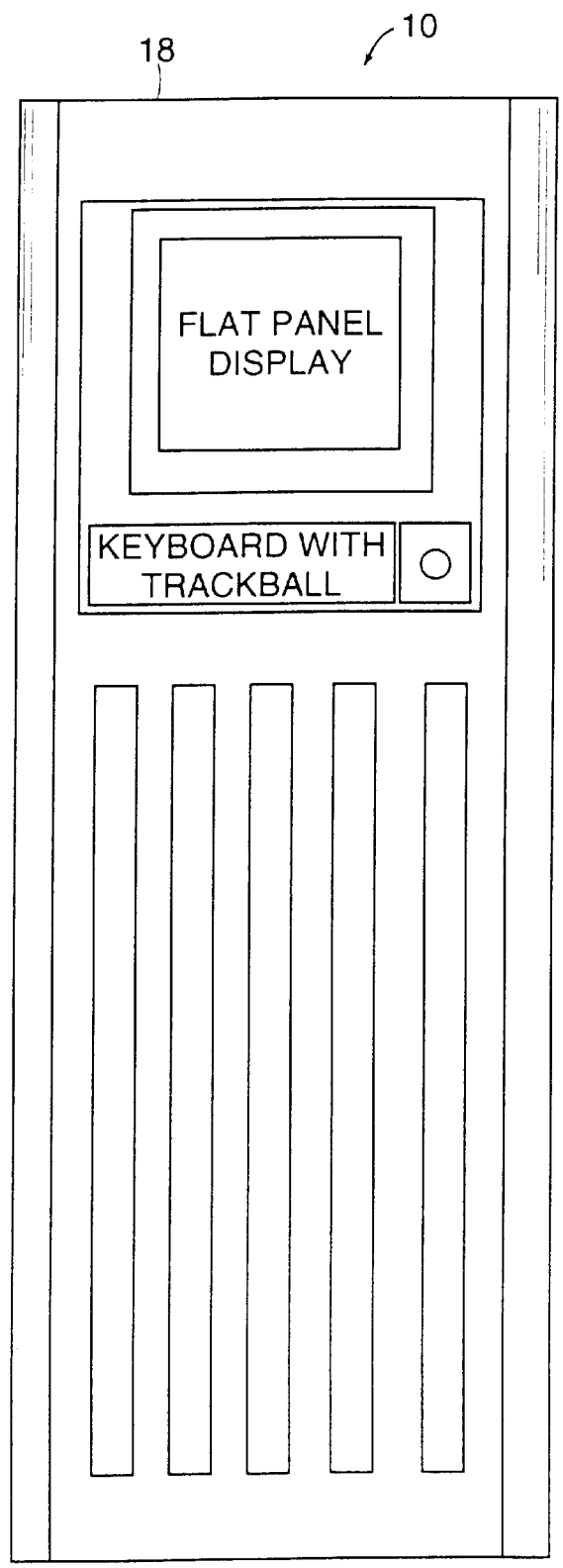
FIGS. 3A–3C are simplified, diagrammatical sketches of the data server of FIG. 1, FIG. 3A showing the front door of a cabinet used to store the components of the data server of FIG. 2, FIG. 3B showing the front of the cabinet when the front door of FIG. 3A is open.
Figure 3B:
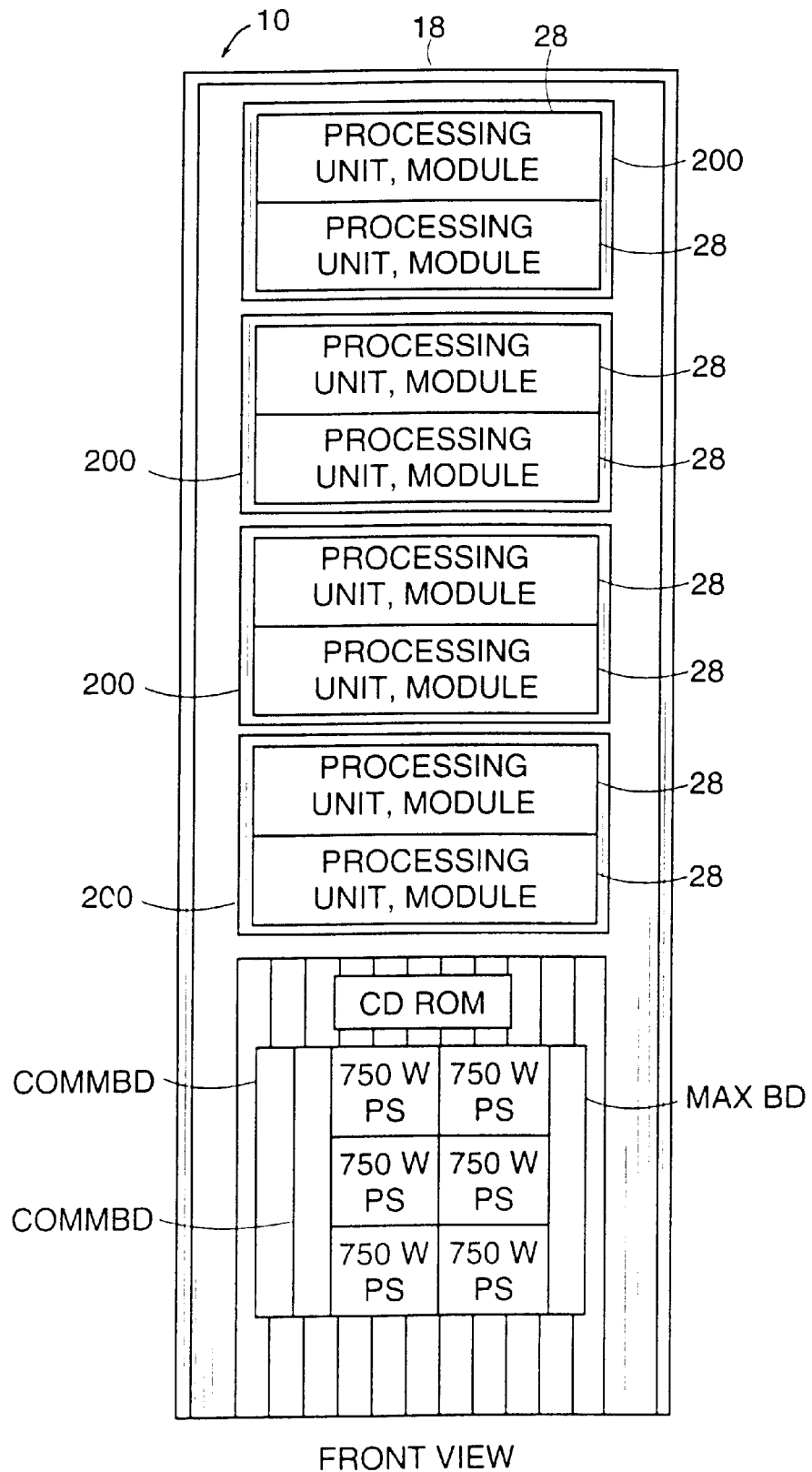
Figure 3C:
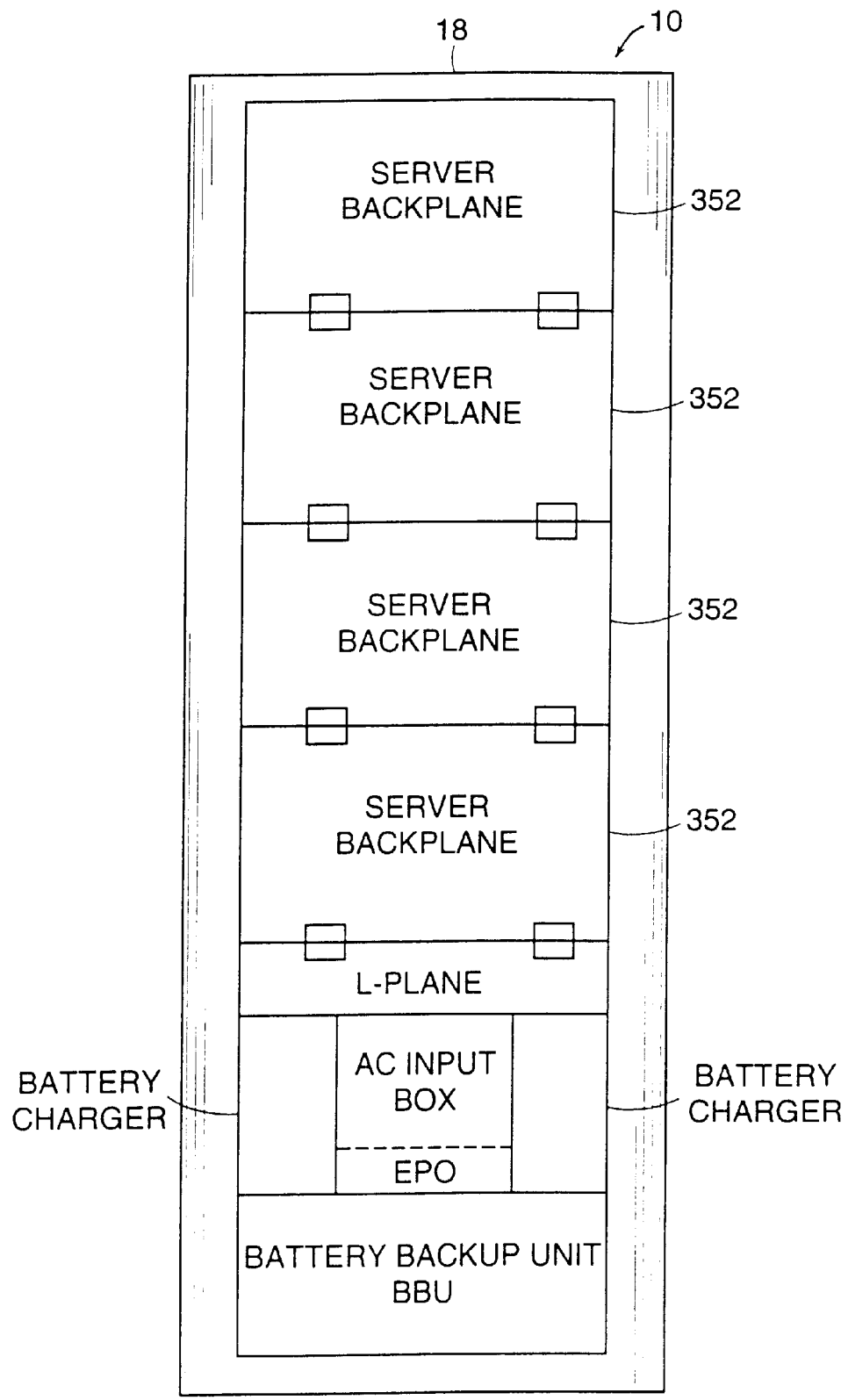
Figure 4A:
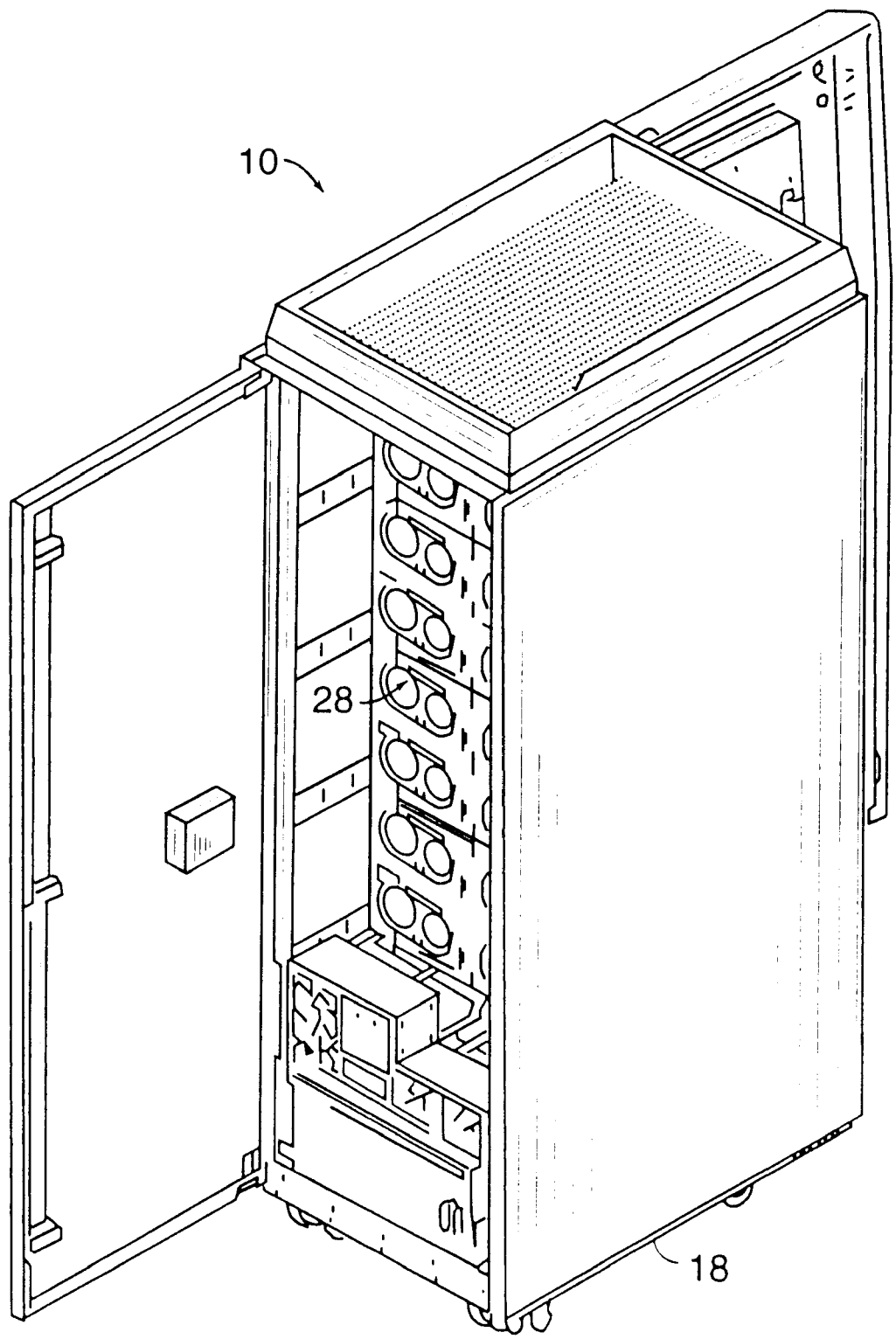
FIGS. 4A and 4B are perspective views of the data server of FIG. 2.
Figure 4B:
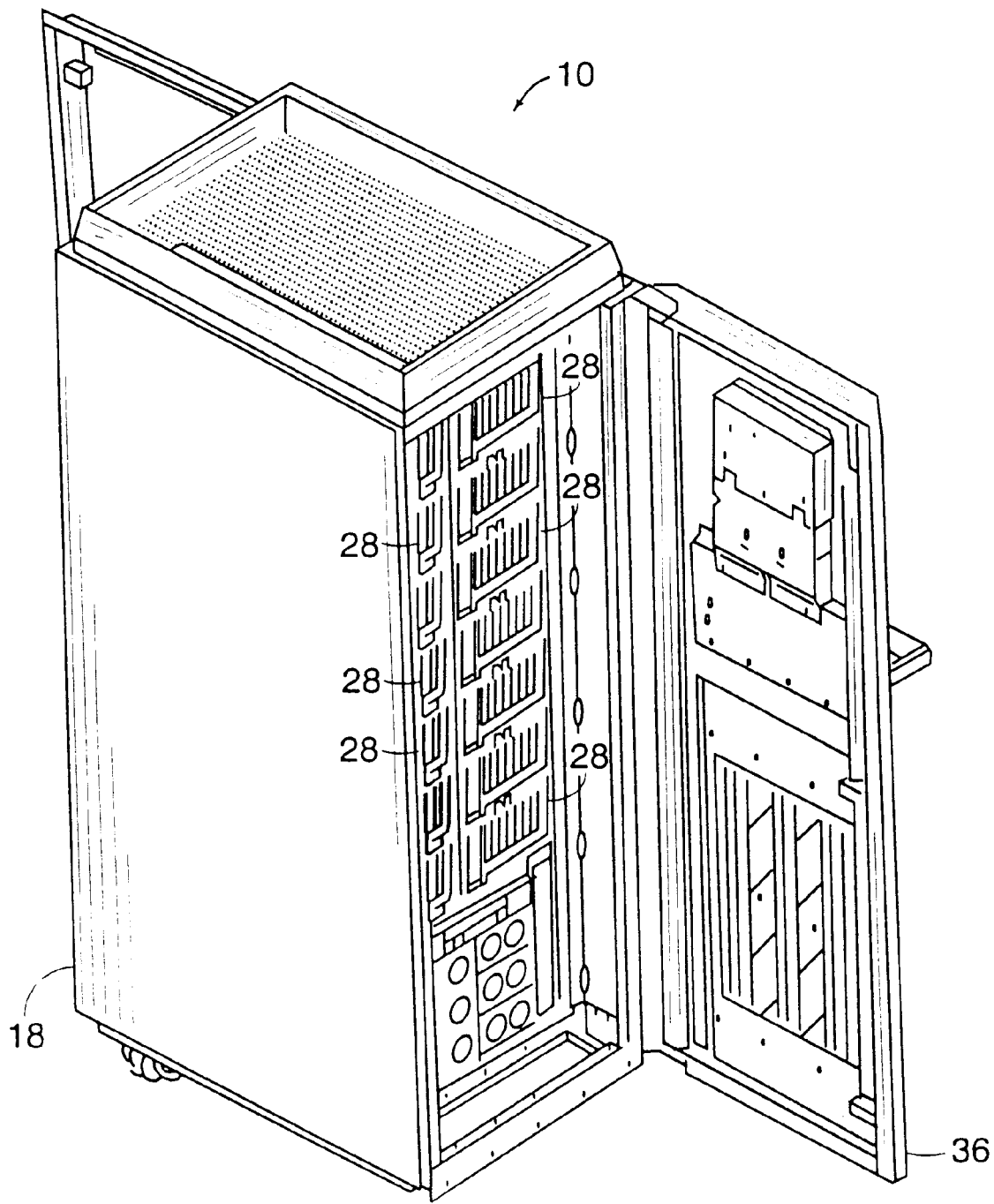

Referring now to FIG. 1, a data server 10 is shown coupled between a storage system 12 and a network 14. The storage system 12 is here a Symmetrix 3500 Integrated Cache Disk Array system manufactured and sold by EMC Corporation, Hopkington, Mass., assignee of the present patent application. The storage system 12 is coupled to the data server 10 through a Fast Wide Differential (FWD) SCSI interconnect 16, as shown.

The data server 10 includes, in a single-cabinet 18 shown in FIGS. 2, 3A–3E, 4A, 4B a plurality of, here up to eight hot replaceable processing unit modules 28. Up to seven of the processing unit modules 28 are data movers. The processing unit modules 28 are all interconnected through a local bus, here an Ethernet bus 24 (FIG. 1), as described in detail in co-pending patent application Ser. No. 08/884,740 filed Jun. 30, 1997 entitled "Data Server Having Hot Replaceable Processing Unit Modules", inventors Gallagher et al., the entire subject matter thereof being incorporated herein by reference. (Hot replaceable means that a component can be removed and/or replaced without an interruption to the system's, here server's, operation.)

Figure 5C:
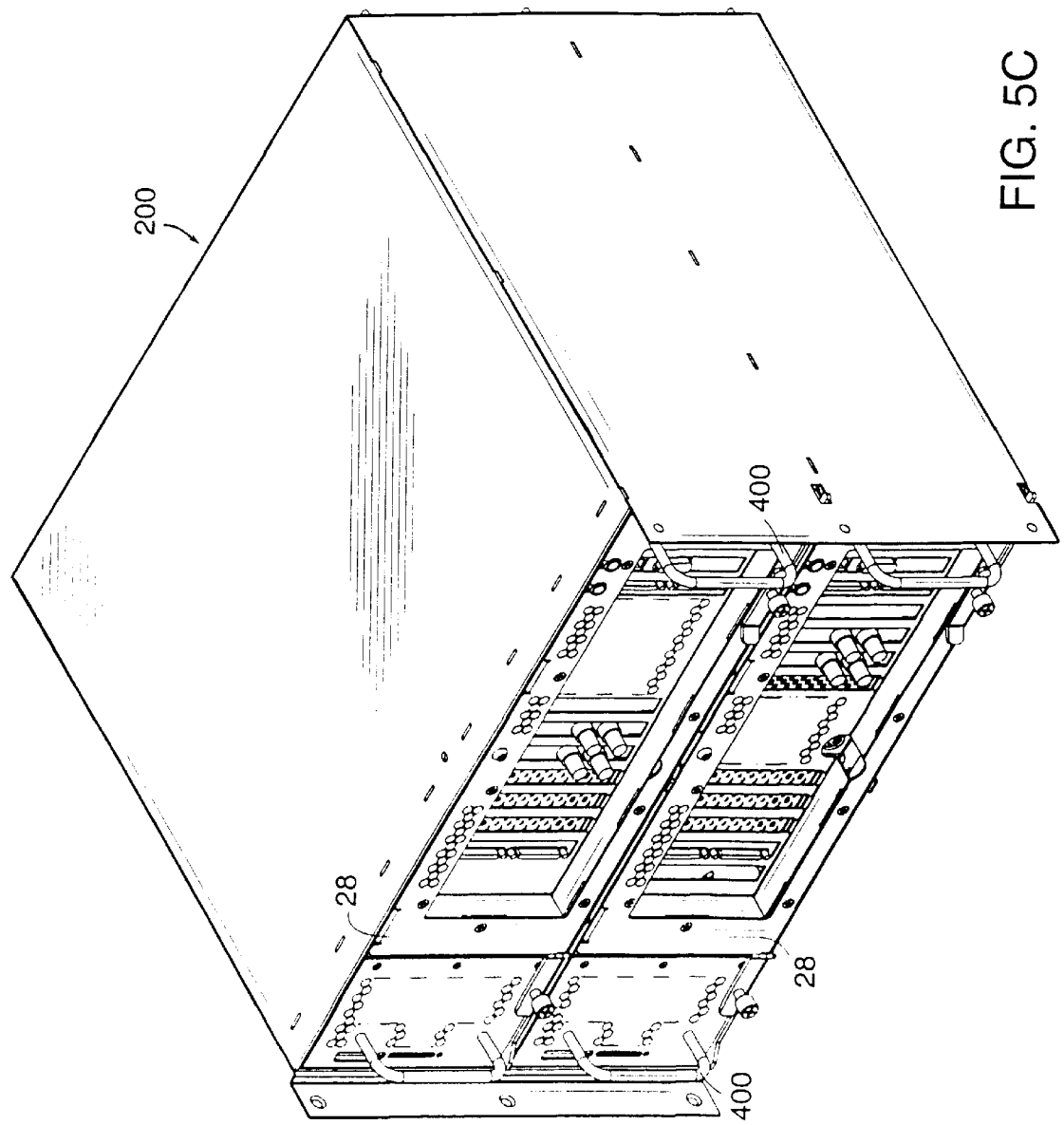
Figure 6A:
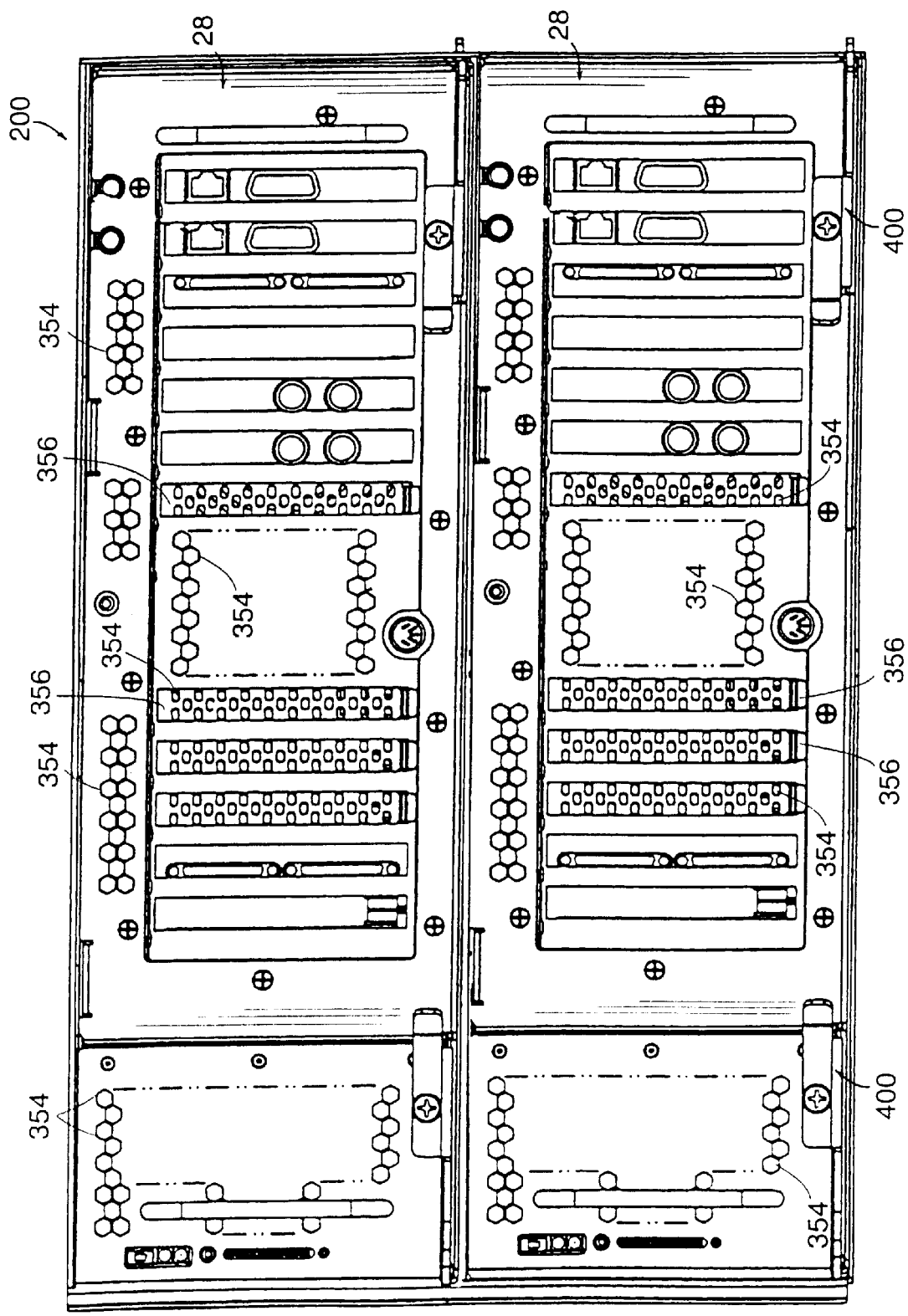
FIGS. 6A, 6B, and 6C are front elevation drawings showing the chassis of FIG. 5 storing two processing modules.
Figure 6B:
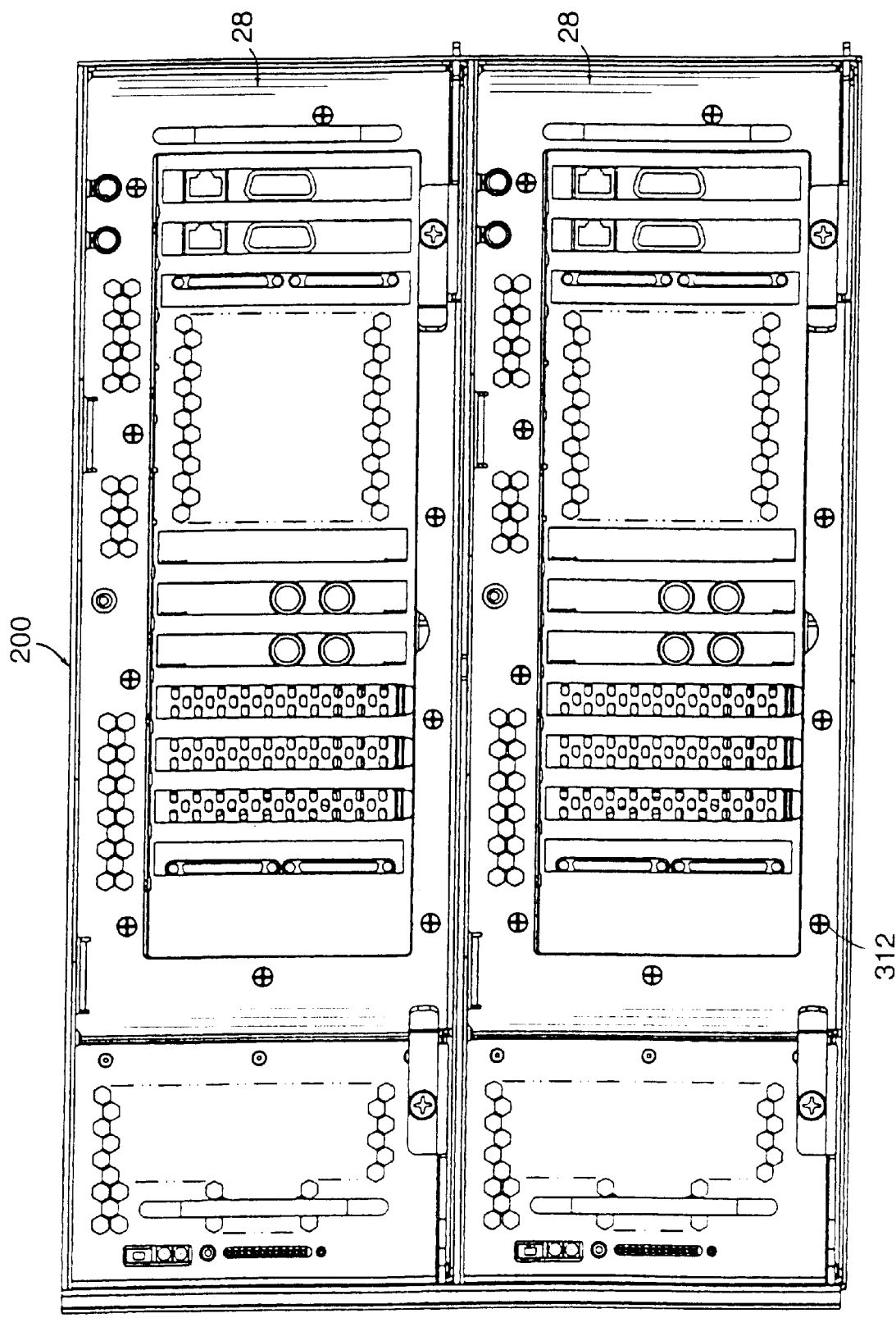
Figure 6C:
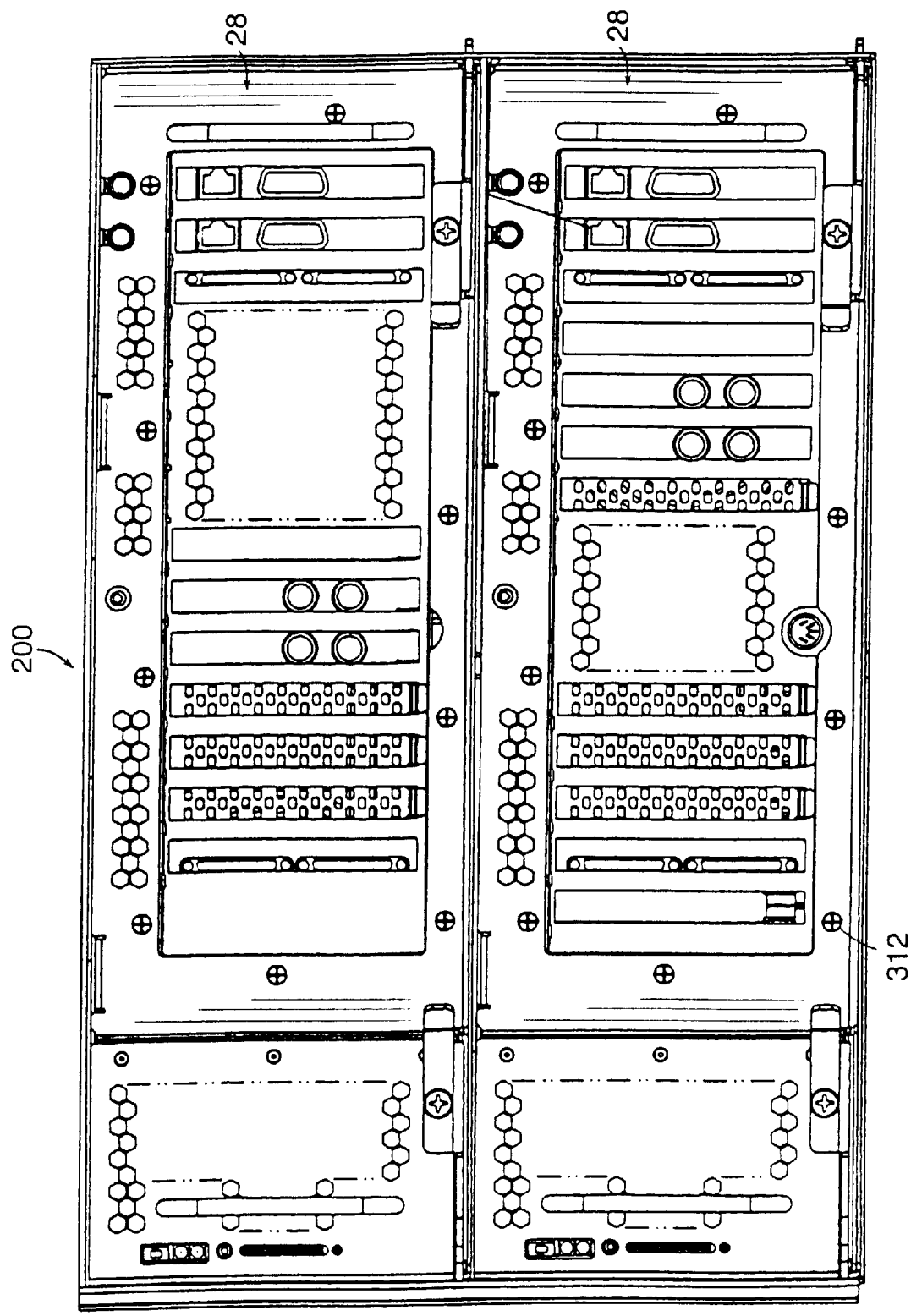

More particularly, fastened within in the cabinet 18 (FIG. 3B) is a set of four sheet metal chassis 200, an exemplary one thereof being shown in FIG. 5. Disposed between upper and lower panels 202, 204 is an intermediate shelf 206 fastened to opposing side panels 210. Each chassis is adapted to store two processing unit modules 28 as shown in FIGS. 5A, 5B and 5C. It is noted that here there are two different types of processing unit modules 28. FIGS. 5A and 6A show an arrangement where both modules 28 are of the same first type; FIGS. 5B and 6B show an arrangement where both modules 28 are of the same second type; and FIGS. 5C and 6C show an arrangement where one of the two modules 28 is the first type and the other one of the modules 28 is the second type.

Figure 7A:
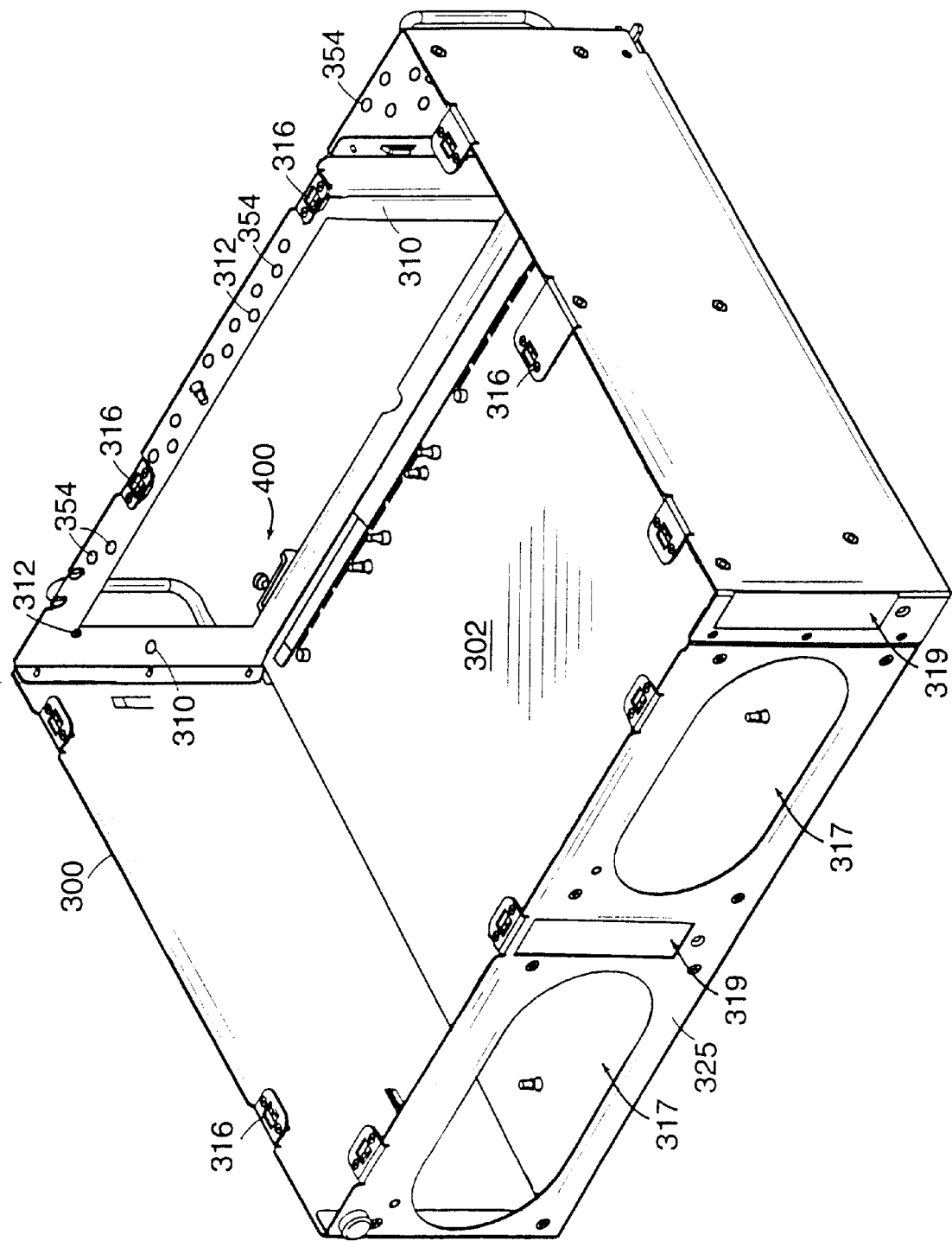
FIGS. 7A and 7B are rear and front perspective drawings, respectively, of a universal case according to the invention for either the first type or second type of processing unit modules shown in FIGS. 5A–5B, such case being shown with a cover therefor removed.
Figure 7B:
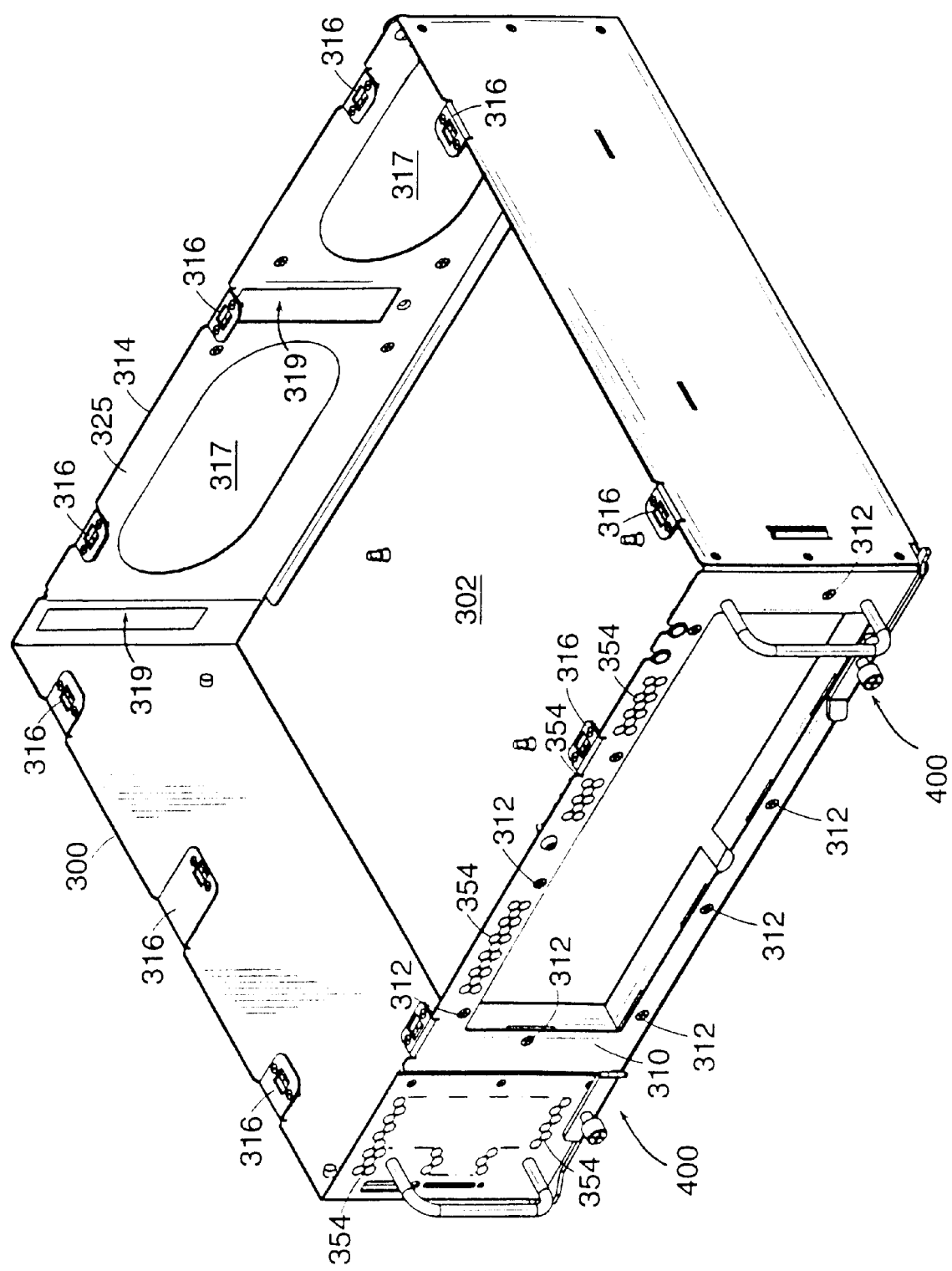
Figure 12A:
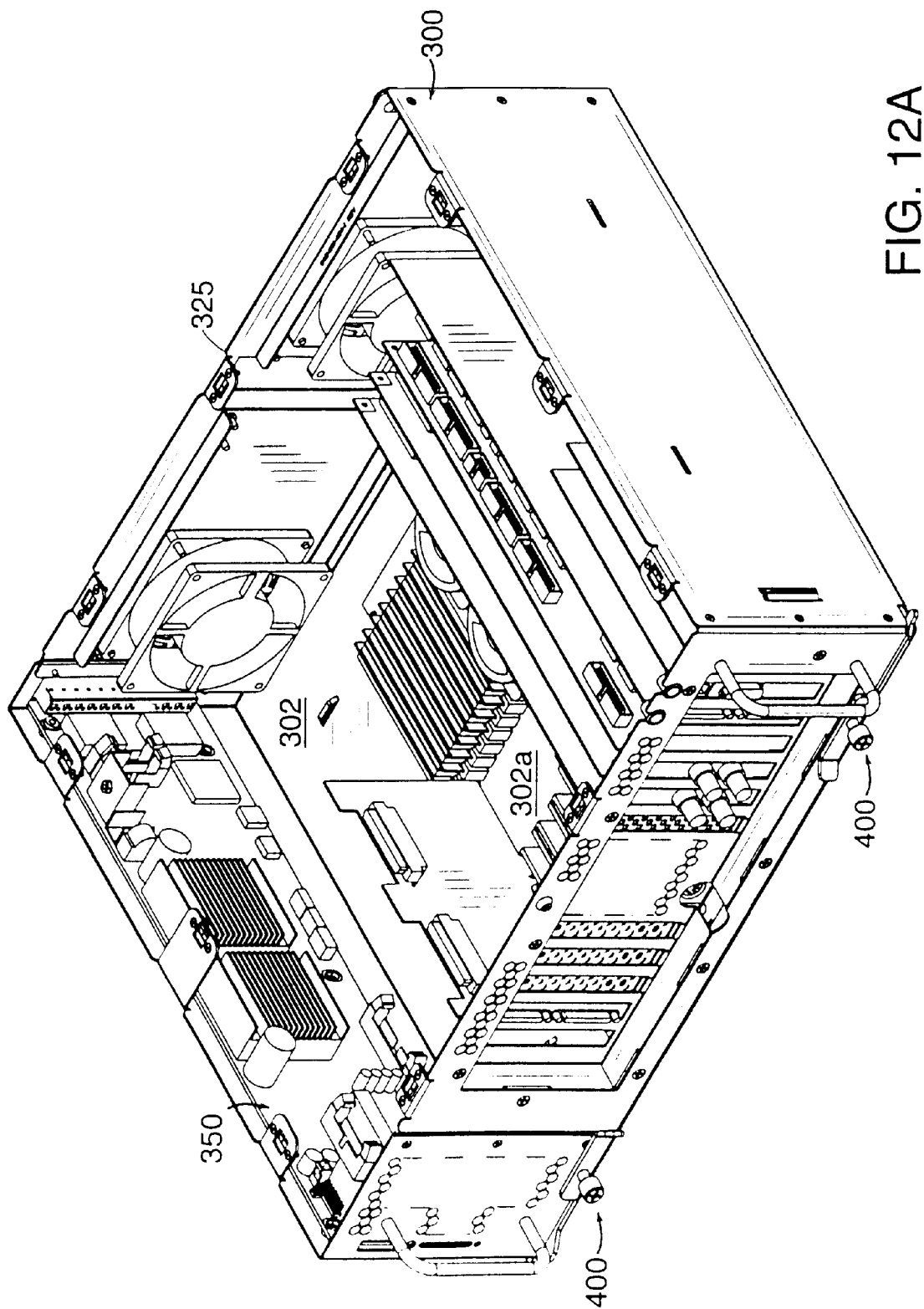
FIGS. 12A and 12B are front perspective drawings of the cases of FIGS. 7A and 7B configured as the first type and second type of processing unit modules, respectively, such cases being shown with the cover therefor removed.
Figure 12B:
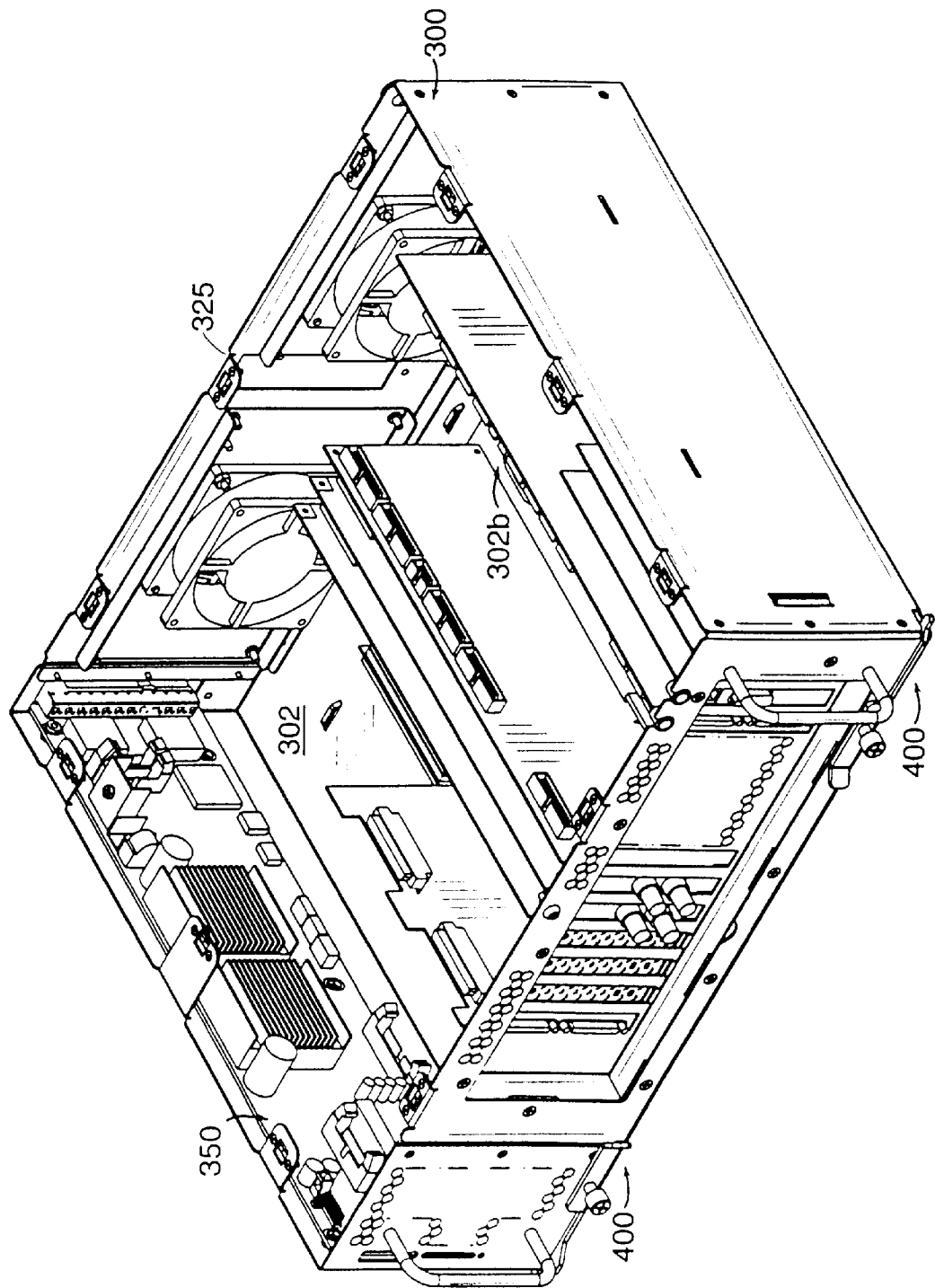
Figure 13A:
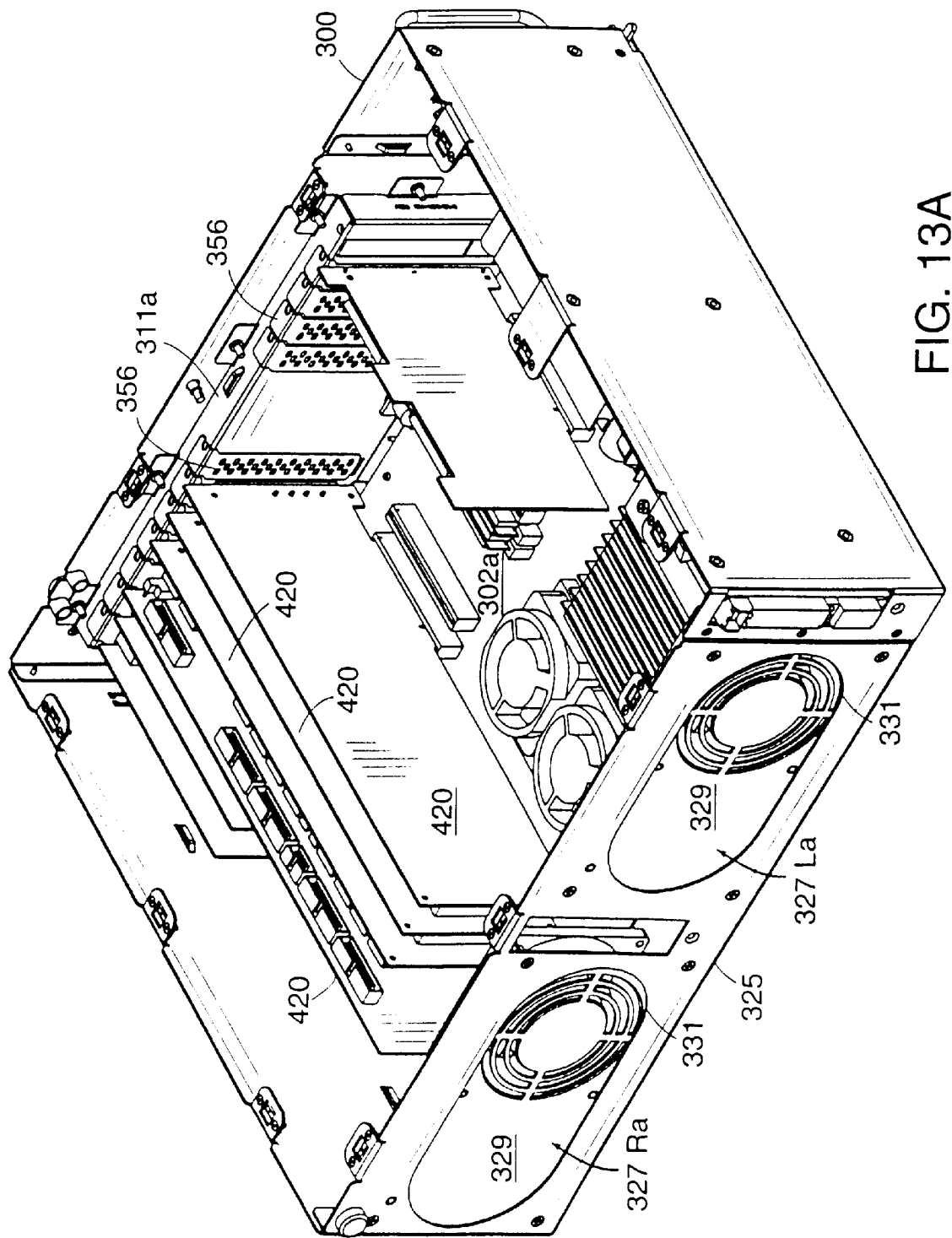
FIGS. 13A and 13B are rear perspective drawings of the cases of FIGS. 7A and 7B configured as the first type and second type of processing unit modules, respectively, such cases being shown with the cover therefor removed.
Figure 13B:
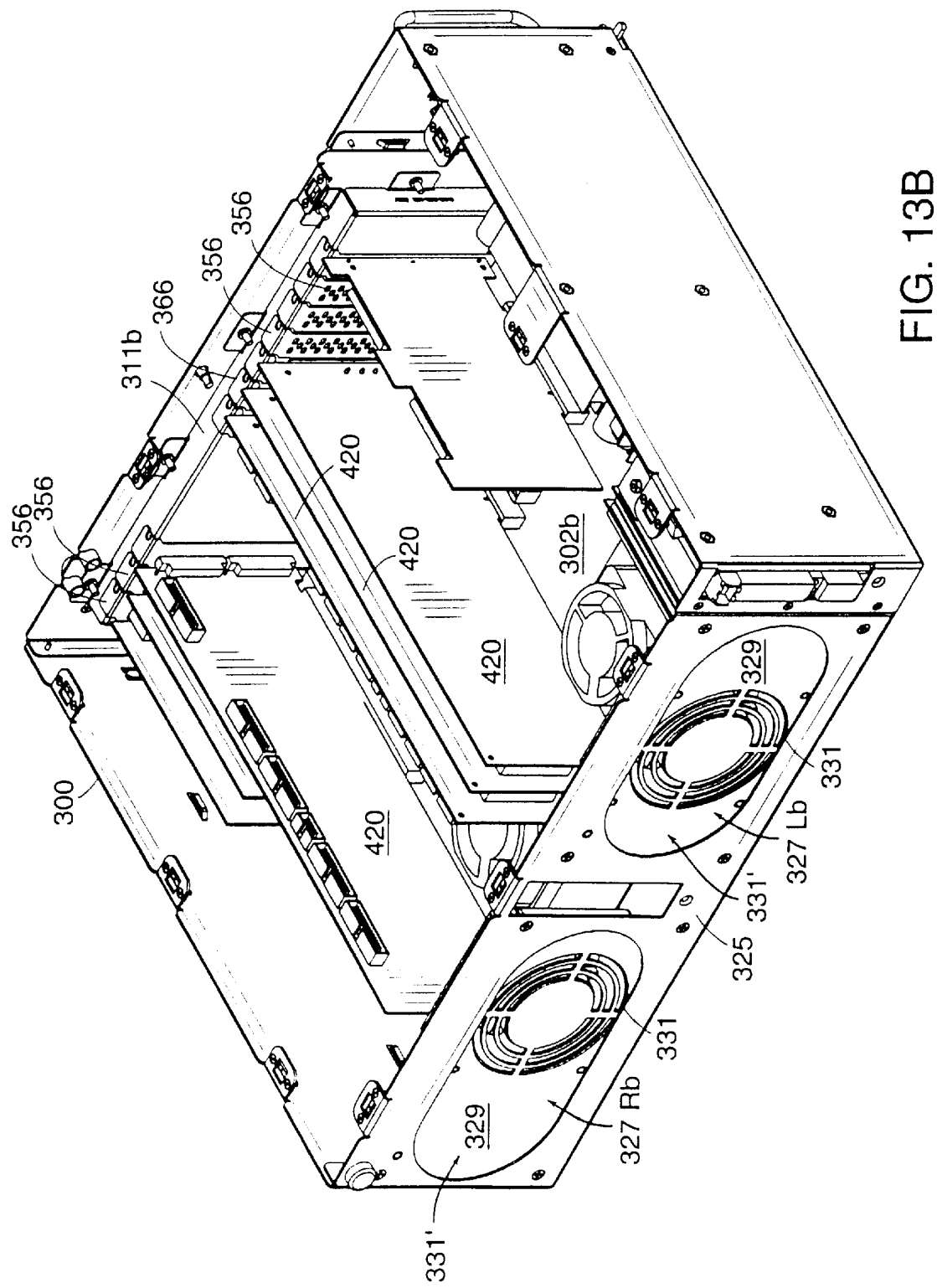

Referring now to FIGS. 7A and 7B, a universal sheet metal case 300 is shown adapted for either the first or second type of processing unit modules 28. FIGS. 12A and 13A show the case 300 configured as the first type of processing unit modules 28, such case 300 being shown with the cover therefor removed; and FIGS. 12B and 13B show the case 300 configured as the second type of processing unit modules 28, such case 300 also being shown with the cover therefor removed. It is noted that the front of each case 300 has a pair of lock-release mechanisms 400; one on each front side of the case. Each lock-release mechanism 400 is similar to the lock-release mechanism described in the above-referenced patent application and is used to lock the case 300 in the chassis 200 and to remove the case 300 from the chassis 200. The case 300 (FIGS. 7A and 7B) has a pair of oval shaped holes 317 formed through the rear surface 325 of the case 300 for air flow, to be described. The rear surface 325 also serves as a fan mounting surface for fan assemblies to be described. A pair of elongated, vertically orientated slots 319 is provided in the rear surface 325 for Teradyne HDM connectors, not shown, as described in the above referenced patent application.

Figure 8A:
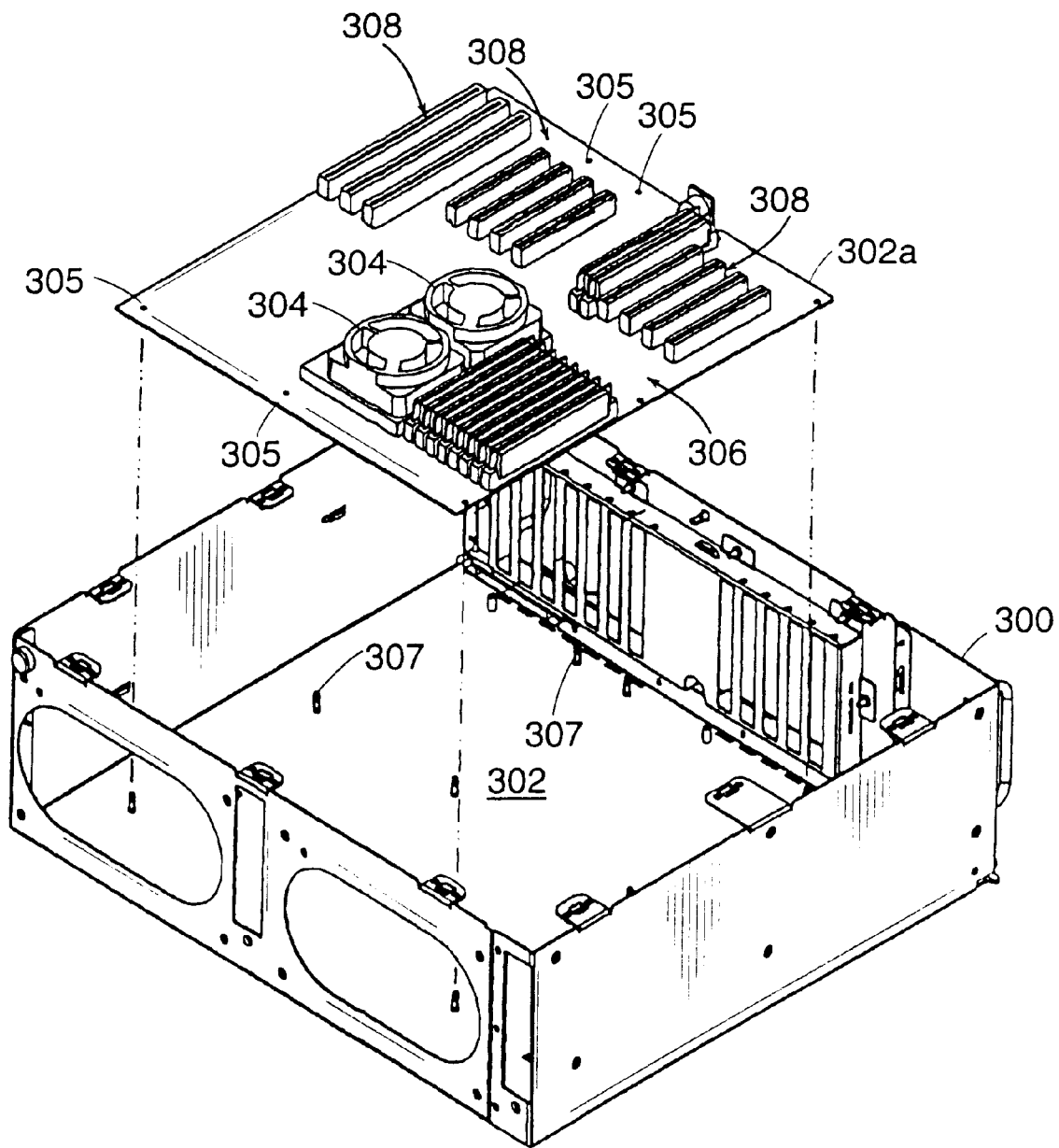
FIGS. 8A and 8B are exploded perspective drawing of the case of FIGS. 7A and 7B, such drawings showing first and second motherboards for the first and second types of modules, respectively.
Figure 8B:
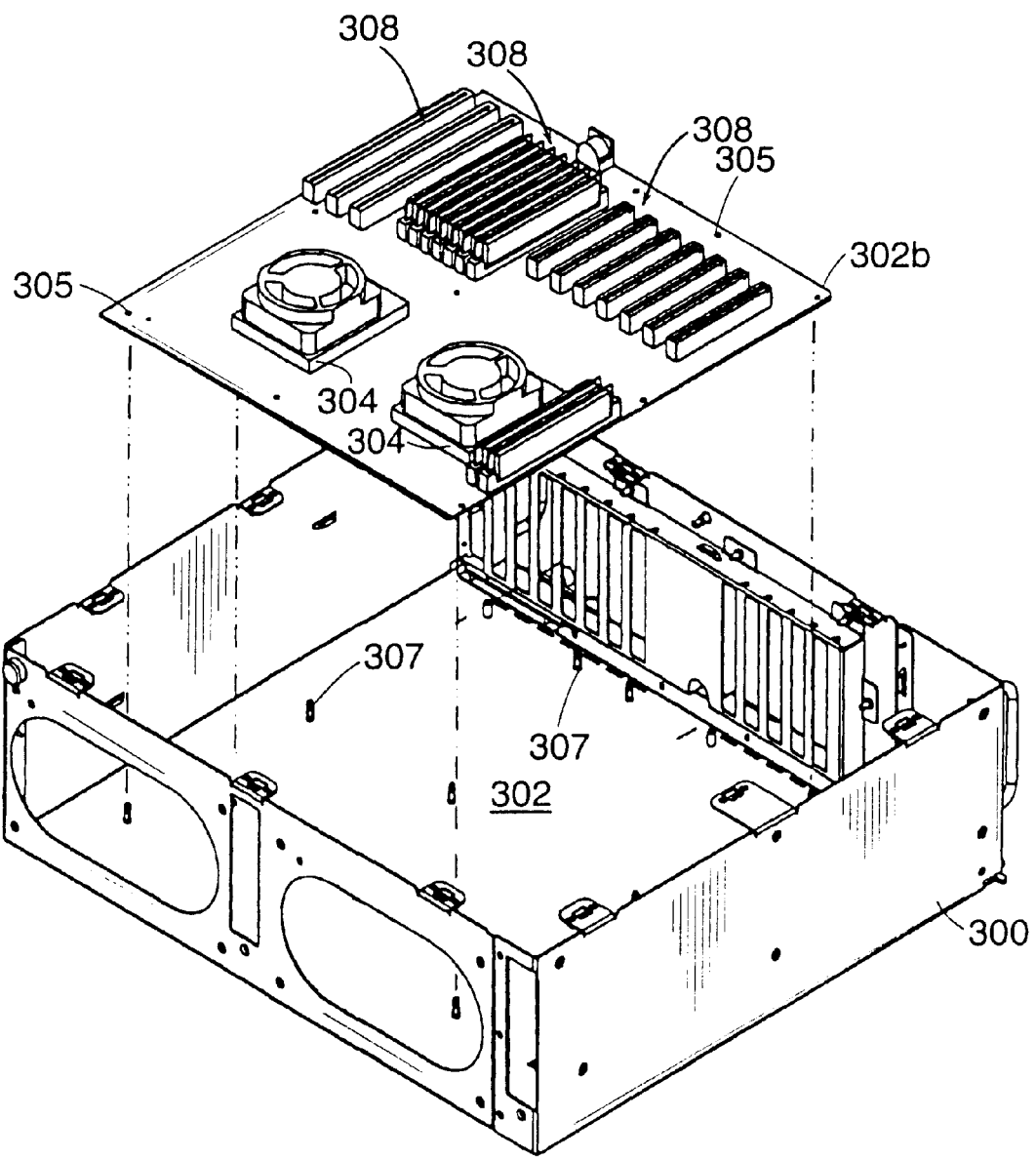

It is noted that the processing unit module 28 is configured to enable use of market available processing unit module motherboards. Thus, the case 300 has a motherboard mounting surface 302 (FIGS. 7A and 7B), here the bottom surface, adapted to have mounted thereto one of a plurality of differently configured motherboards 302a, 302b as shown in FIGS. 8A and 8B respectively. Each one of the motherboards 302a, 302b has holes 305 for enabling the motherboards 302a, 302b to snap onto posts 307 projecting upward from the bottom surface 302 of the case 300. Each one of the differently configured motherboards 302a, 302b has a different arrangement of a CPU 304, main memory slots 306 and I/O adapted card slots 308. It is also noted that the placement of the pair of fan-mounted CPUs 304 used in the motherboard 302a is different from the placement of the pair of fan-mounted CPUs 304 in motherboard 302b. The front panel 310 has a plurality of air-holes 354 (FIGS. 7A, 7B) therein. Therefore, case 300 is a universal case which may be used for anyone of a repertoire of differently configured motherboards.

Figure 9A:
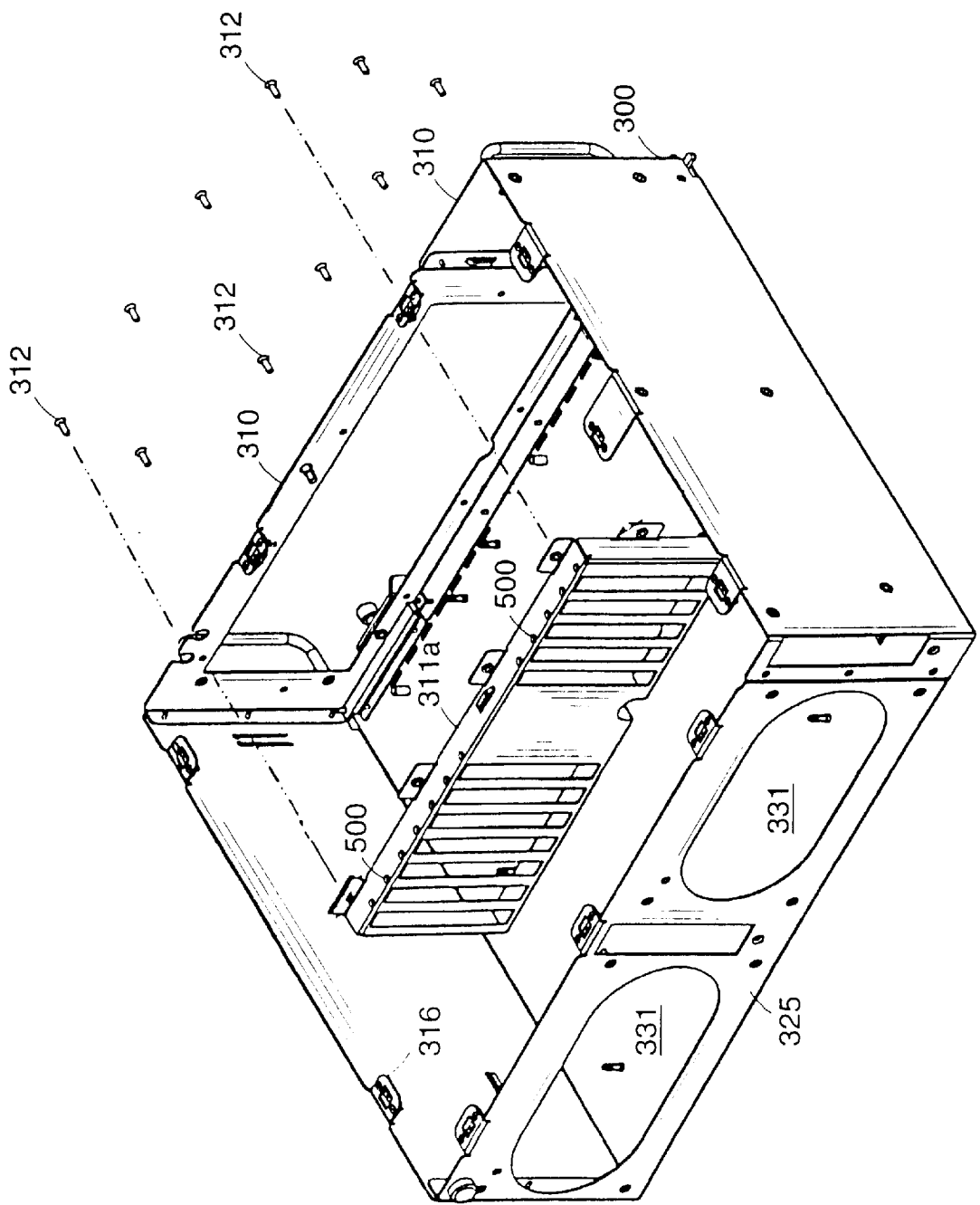
FIGS. 9A and 9B are exploded perspective drawing of the case of FIGS. 7A and 7B, such drawings showing first and second I/O adapter card bulkheads for the first and second motherboards, respectively.
Figure 9B:
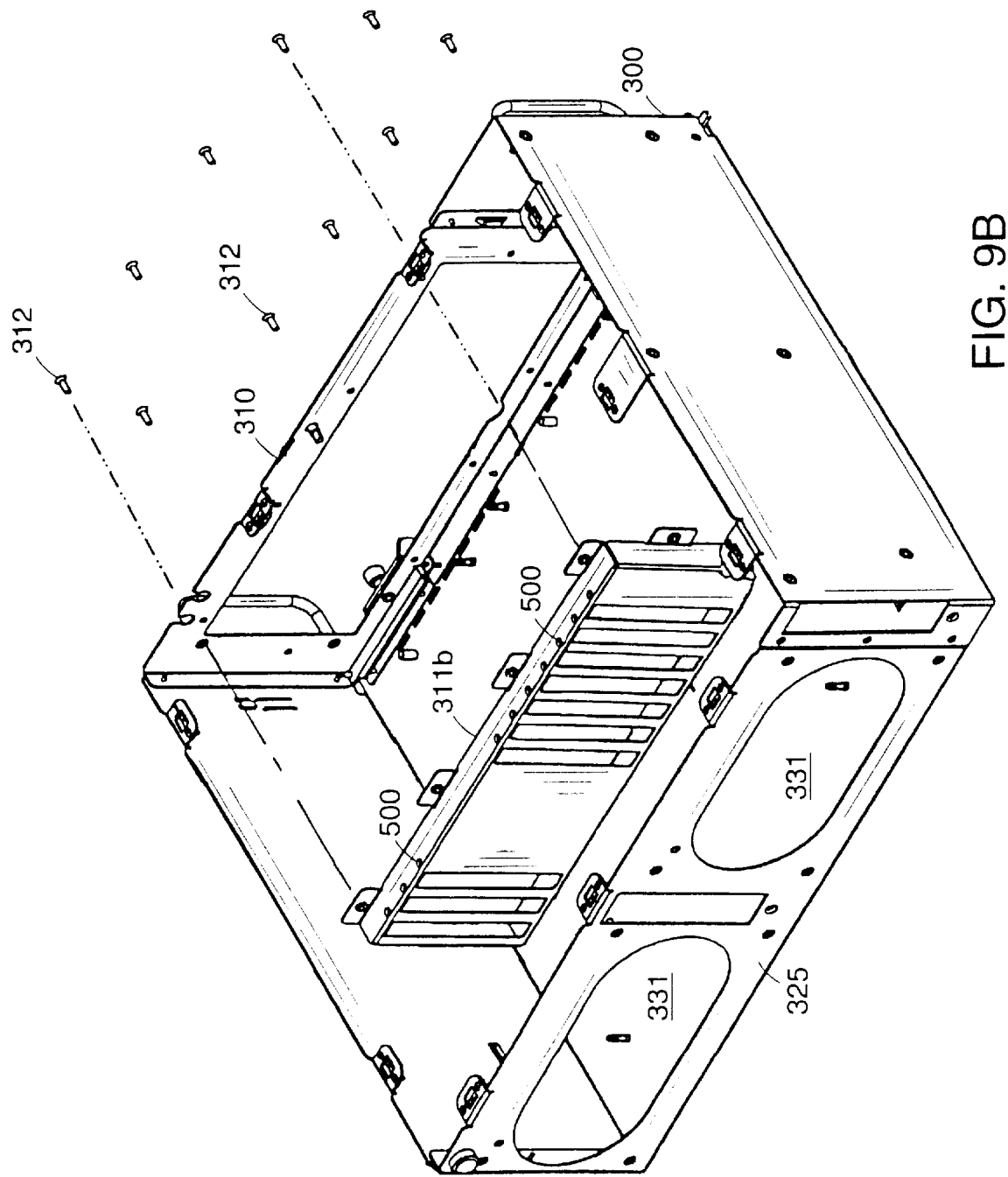

The case 300 (FIGS. 7A and 7B) also has a front, bulkhead mounting surface 310, here the front bezel, adapted to have mounted thereto one of a plurality of differently configured I/O adapter card bulkheads 311a, 311b by the same mounting mechanism, here by a set of ten screws 312, as indicated in FIGS. 9A and 9B. Each one of the differently configured bulkheads 311a, 311b is specifically configured for a corresponding one of the differently configured motherboards 302a, 302b, respectively, as indicated; more particularly for the particular I/O slot 308 (FIGS. 8A and 8B) arrangement used by the motherboard.

Thus, the case 300 may be used for the one of a repertoire of differently I/O adapter card bulkheads 311a, 311b which is suitable for the one of the motherboards 302a, 302b, respectively, as indicated, mounted in the case 300.

Figure 10A:
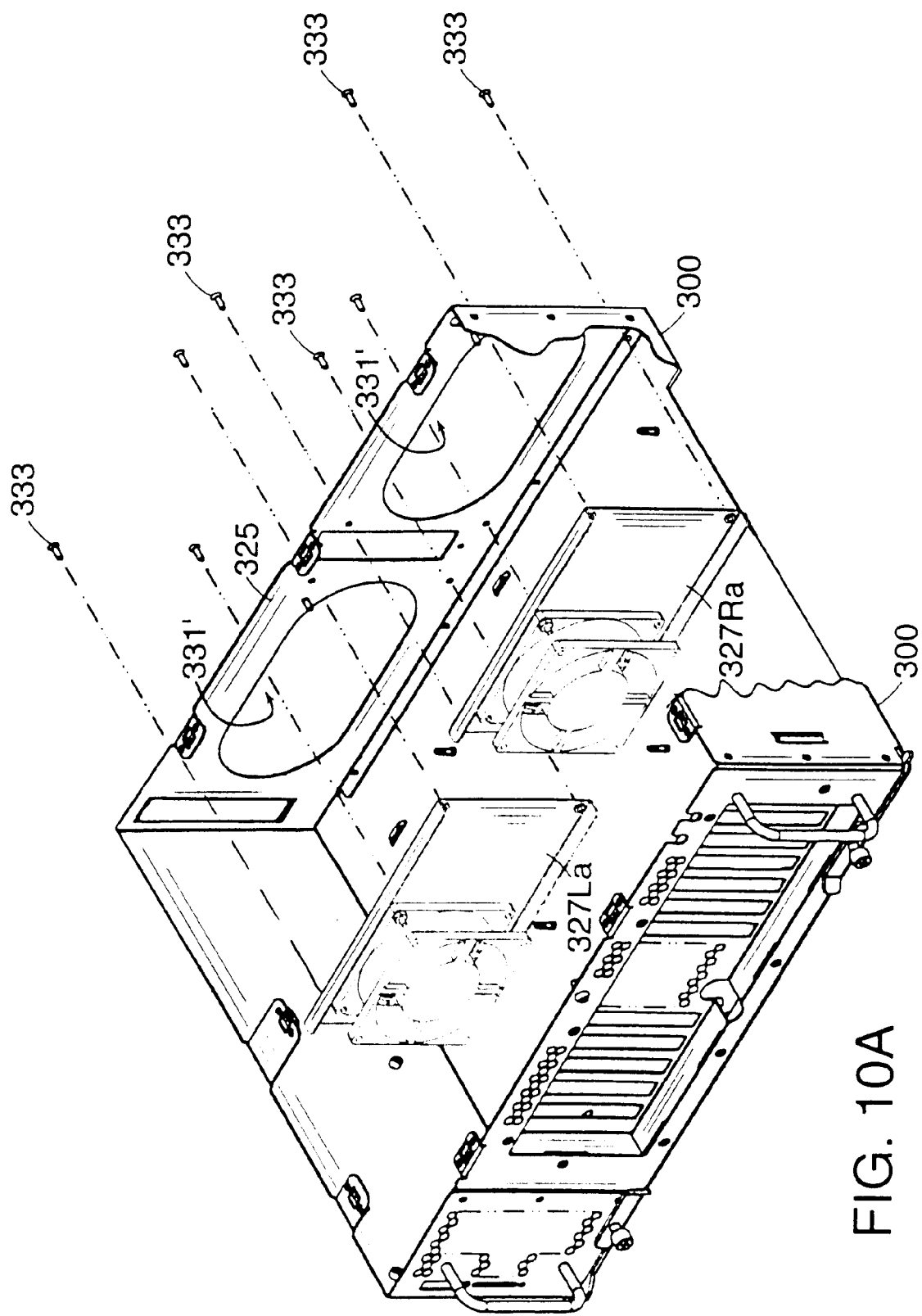
FIGS. 10A and 10B are exploded, partially broken away perspective drawing of the case of FIGS. 7A and 7B, such drawings showing first and second fan assemblies for the first and second motherboards, respectively.
Figure 10B:
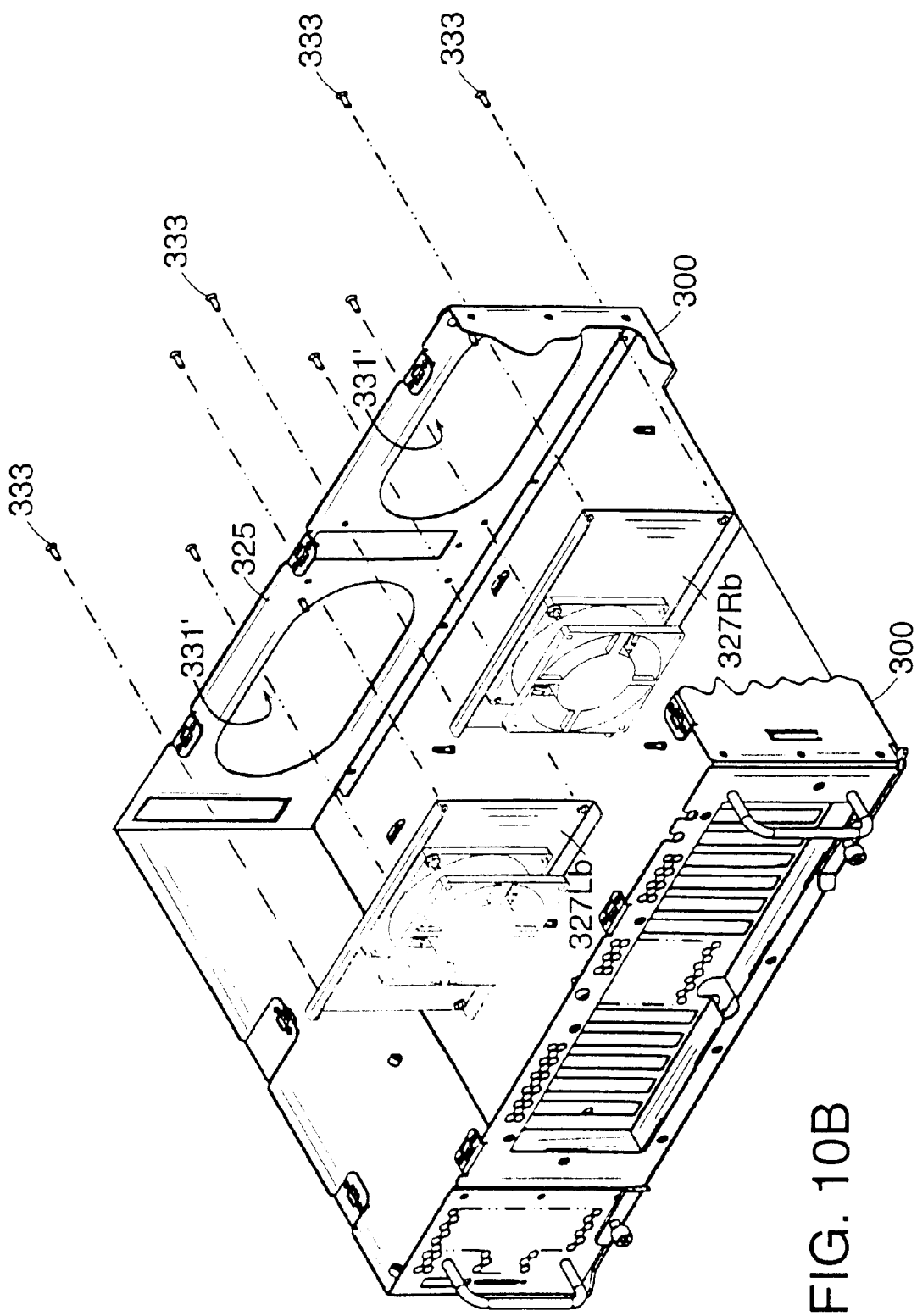

As noted above, the case 300 (FIGS. 7A and 7B) has a fan mounting surface 325, here the rear surface, adapted to have mounted thereto one of a plurality of differently configured fan assemblies 327La, 327Ra and 327Lb, 327Rb as indicated in FIGS. 10A and 10B, respectively. The fan assembly 327La shown on the left in FIG. 10A is shown more clearly in the left side of FIG. 11A, the fan assembly 327Ra shown on the right in FIG. 10A is shown more clearly in the right side of FIG. 11A, the fan assembly 327Lb shown on the left in FIG. 10B is shown more clearly in the left side of FIG. 11B, and the fan assembly 327Rb shown on the right in FIG. 10B is shown more clearly in the right side of FIG. 11B. It is noted that each of the fan assemblies 327La, 327Ra, 327Lb, and 327Rb shown in FIGS. 11A and 11B, respectively, has the same shape fan 321 mounting plate 329 each of which is adapted for fastening to the rear surface 325 of case 300 by screws 333 as indicated in FIGS. 10A and 10B. Each one of the differently configured fan assemblies 327La, 327Ra is configured for motherboard 302a and fan assemblies 327Lb, 327Rb are configured for motherboard 302b. Thus, the case 300 may be used for the one of a repertoire of differently configure fan assemblies 327La, 327Ra, 327Lb, 327Rb which is suitable to provide optimum air-flow cooling to the one of the motherboards 302a, 302b mounted in the case 300, as will be described in connection with FIGS. 15A and 15B.

Figure 11A:
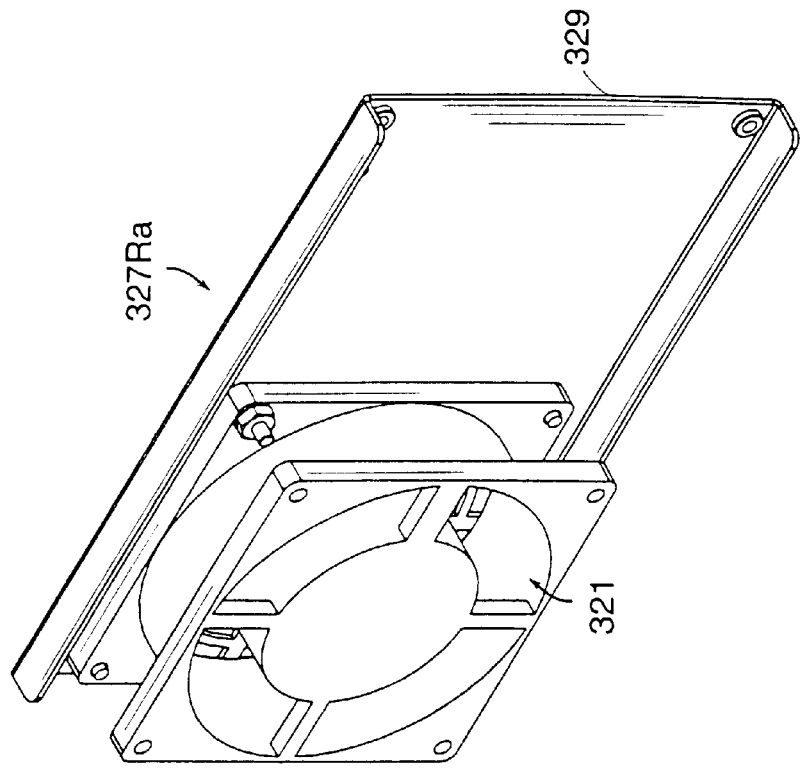
FIG. 11A is a perspective view of the fan assemblies for the first motherboard.
Figure 11A:
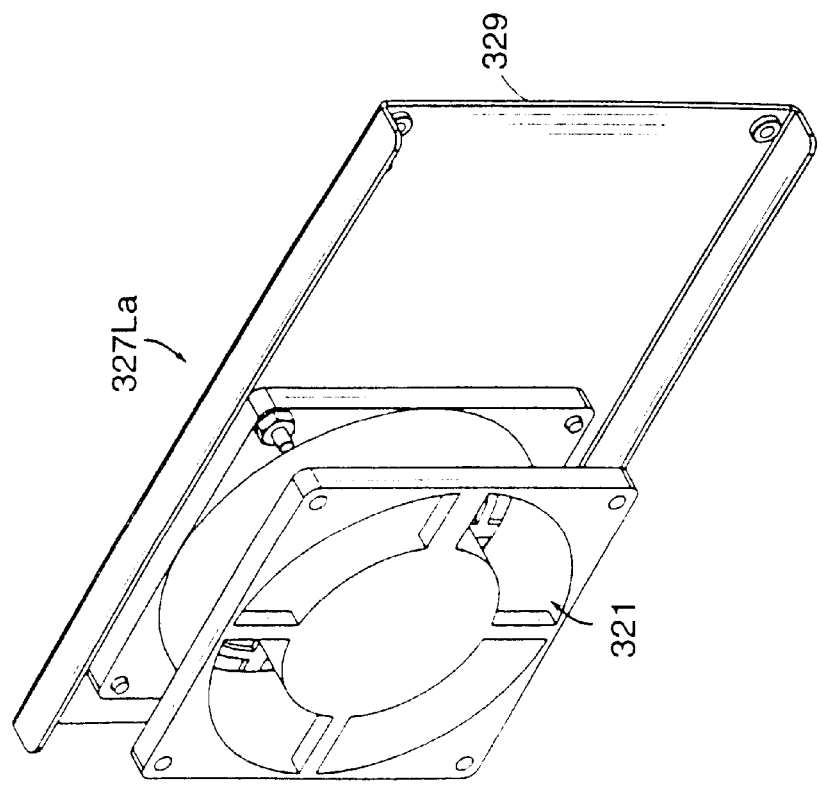
Figure 11B:
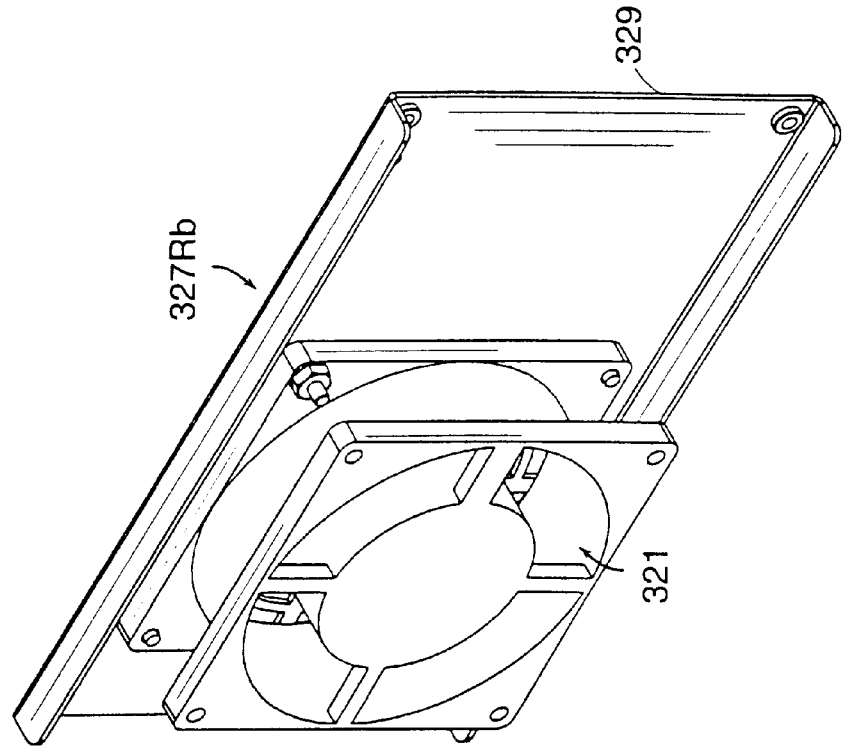
FIG. 11B is a perspective view of the fan assemblies for the second motherboard.
Figure 11B:
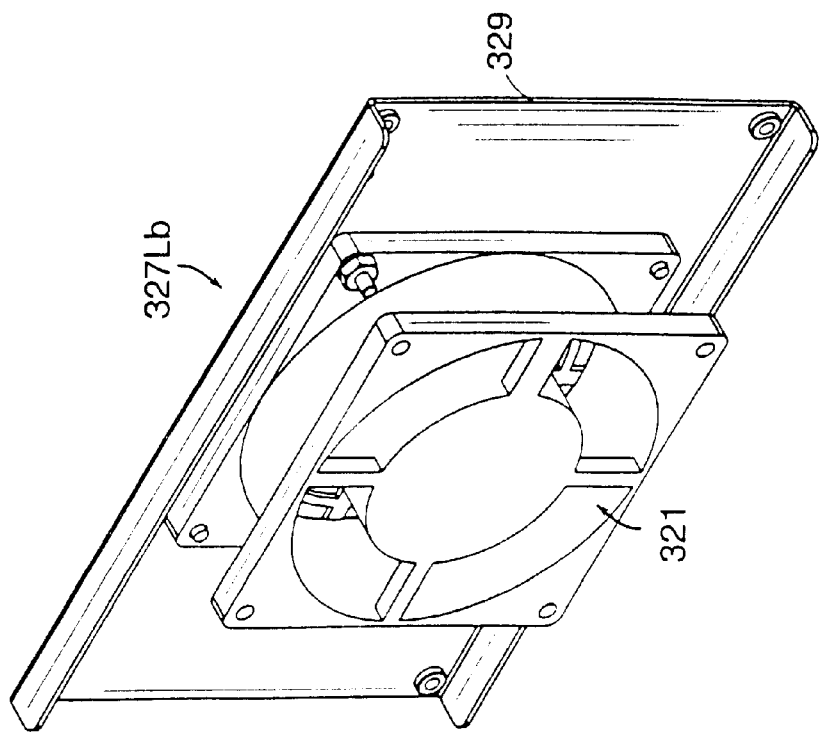

Thus, referring to FIGS, 13A and 13B, each one of the fan assemblies 327La, 327Ra, 327Lb, 327Rb, is adapted for mounting to the rear surface (i.e., rear panel) 325 of case 300 and has a mounting plate 329 with a grate-like aperture 331 formed therethrough and adapted for affixing to the case 300 with the aperture 331 in registration with an aperture 331' (FIGS. 10A, 10B) formed through the rear panel 325 of the case 300. The fans 321 are mounted, here by screws, not numbered, to the mounting plates 329, as shown in FIGS. 11A and 11B with each fan 321 being disposed in registration with the aperture 329, formed in the mounting plate 329.

Figure 14A:
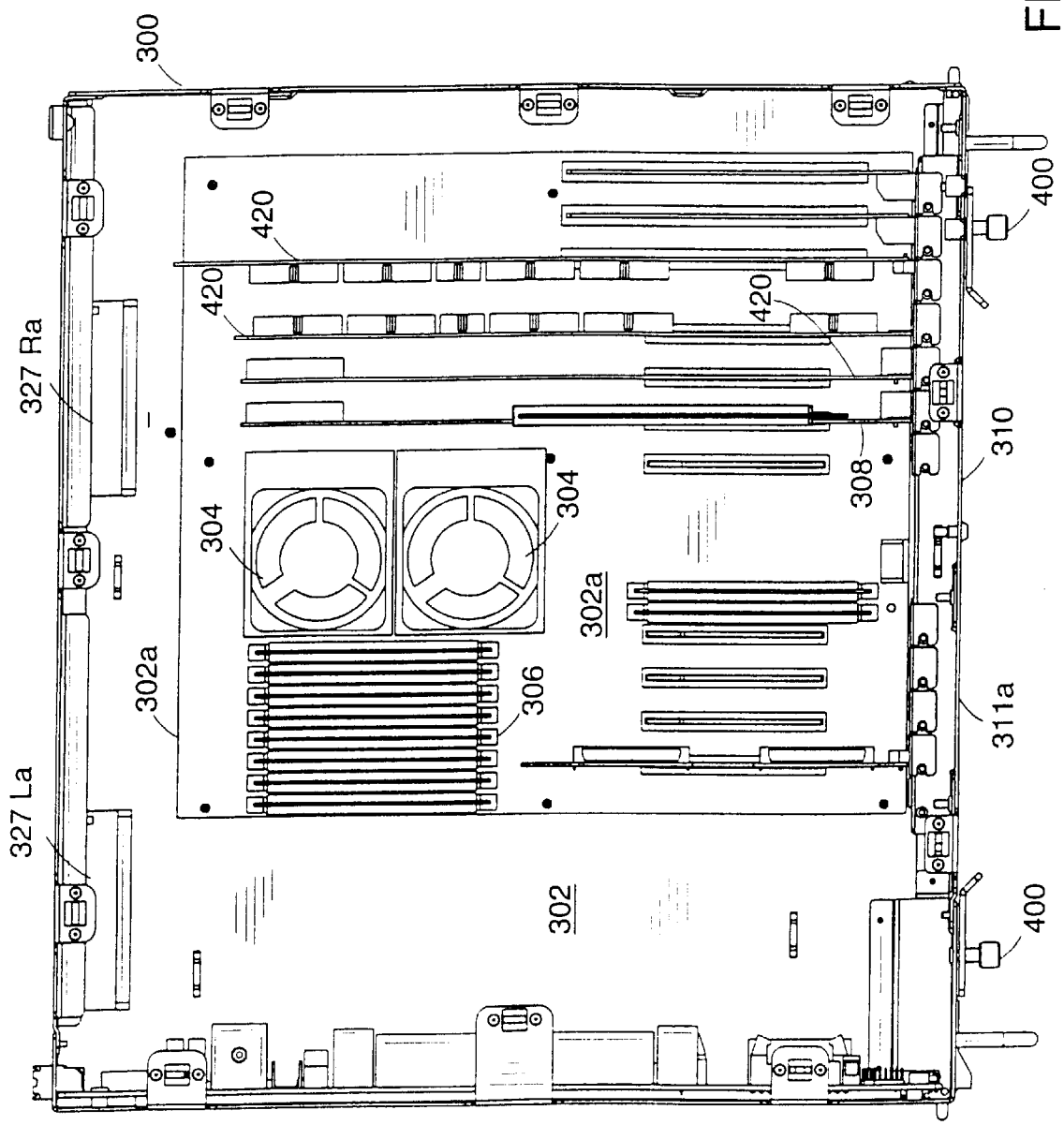
FIGS. 14A and 14B are top plan drawings of the cases of FIGS. 7A and 7B configured as the first type and second type of processing unit modules, respectively, such cases being shown with the cover therefor removed.
Figure 14B:
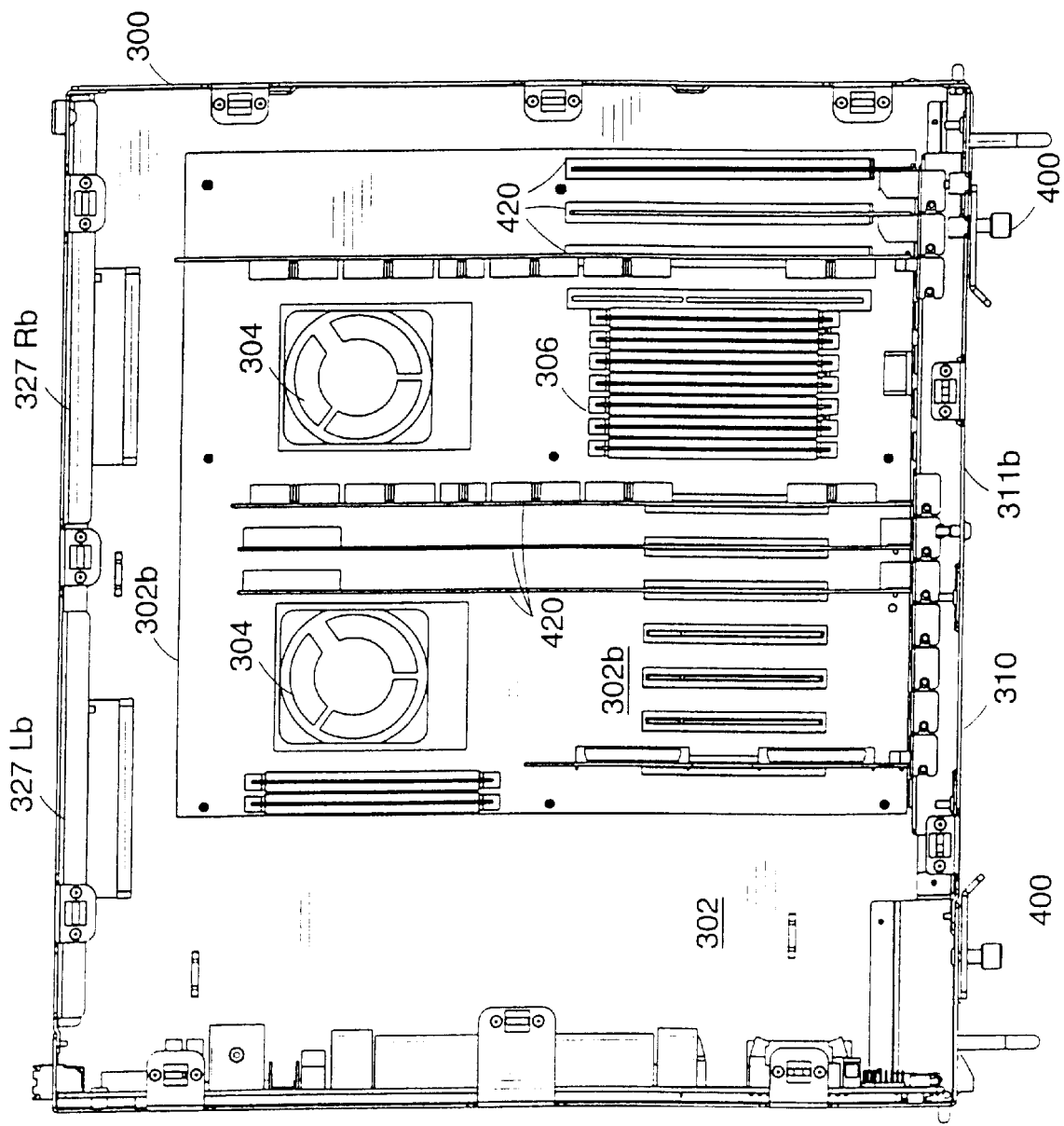

As noted above, FIGS. 12A, 13A and 14A show the case 300 configured as the first type of processing unit modules 28, and FIGS. 12B, 13B and 14B show the case 300 configured as the second type of processing unit modules 28. The air flow for the first type processing unit module is shown by the arrows in FIG. 15A and air flow for the second type processing unit module is shown by the arrows in FIG. 15B.

Figure 16:
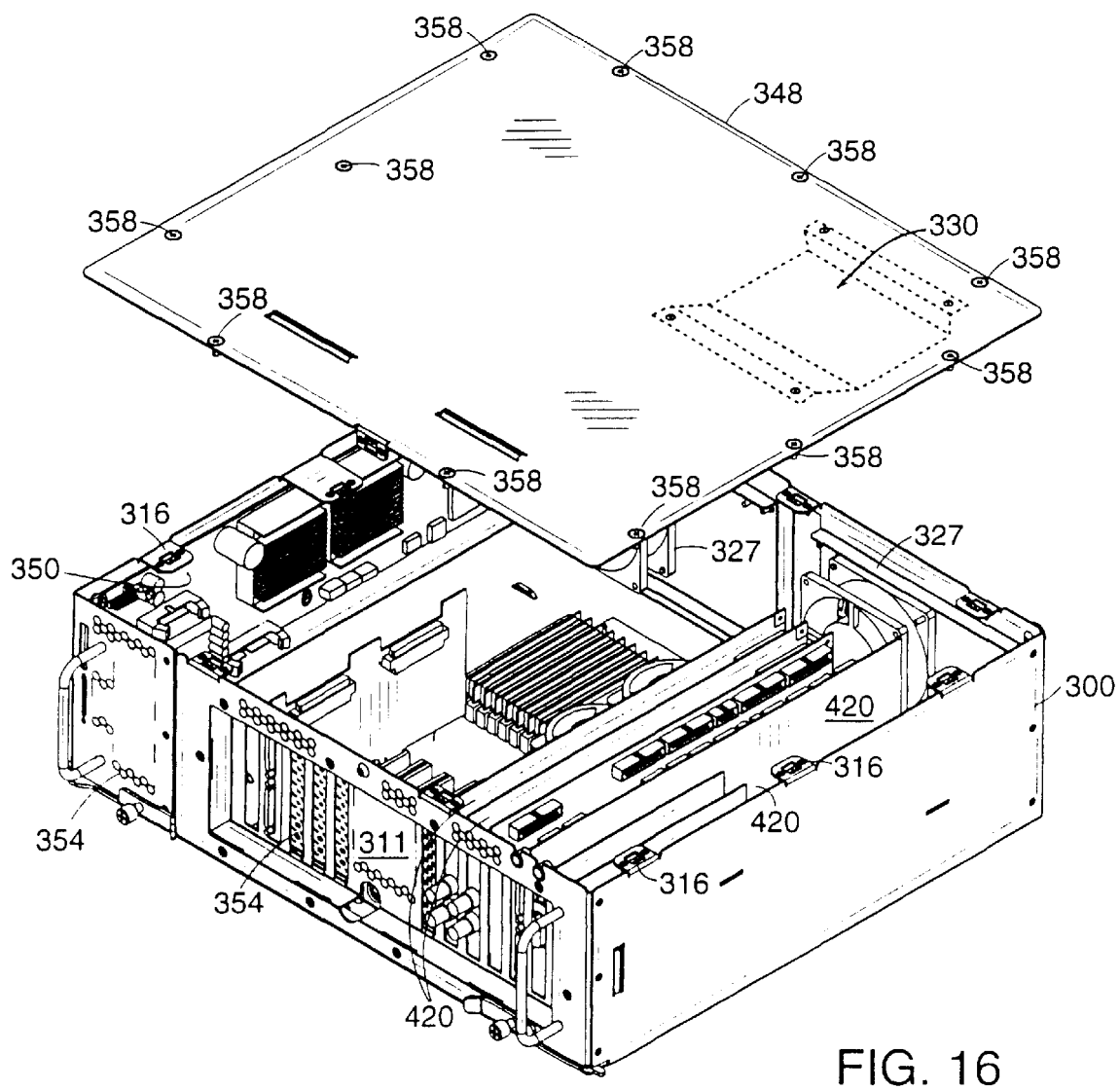
FIG. 16 is an exploded perspective drawing of the case of FIGS. 7A and 7B, such drawing showing a top perspective view of a cover used for the case of FIGS. 7A and 7B.
Figure 17:
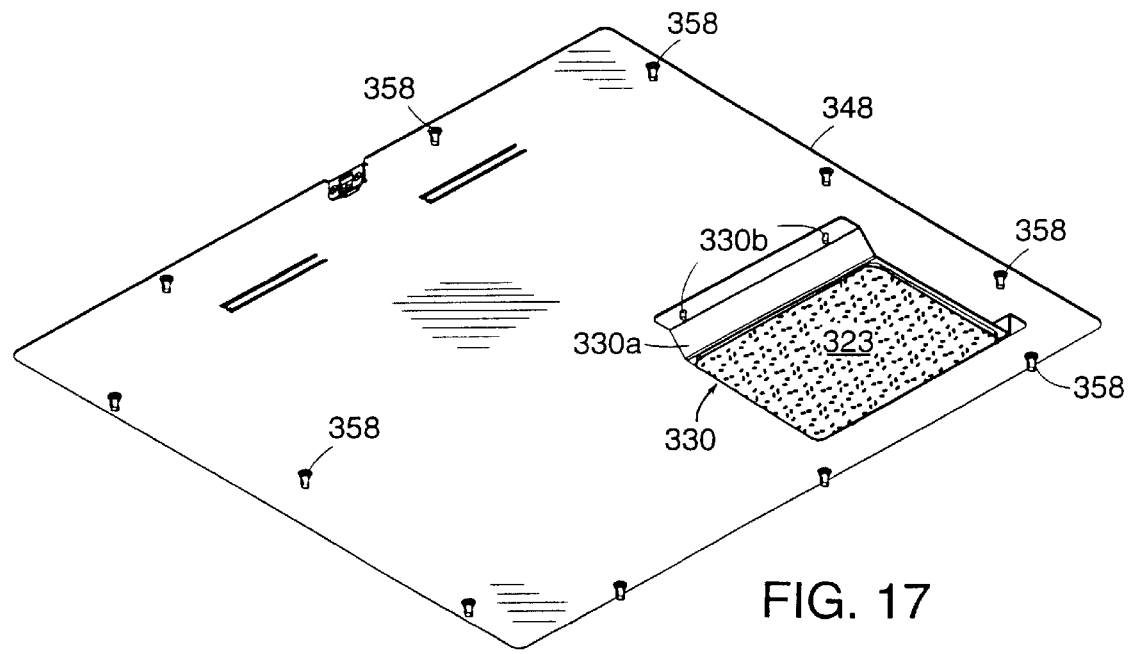
FIG. 17 is a bottom perspective drawing of the cover of FIG. 16, such cover being shown to have an vibration damping pad according to the invention affixed thereto.

Referring now to FIGS. 16 and 17, the case 300 has mounting brackets 316 for enabling a cover 348 to be fastened to the case 300 by screws 358. Each case 300 houses a DC powered, environmentally controlled processing unit module 28. The processing unit module 28 includes the motherboard 302a, 302b disposed on the bottom surface 302 of the case 300, a data server interconnect printed circuit board 350 (FIGS. 14A and 14B) mounted along one side of the case 300 which plug into a backplane 352 (FIG. 3C) as described in the above-referenced co-pending patent application, the pair of DC fan assemblies 327La, 327Ra and 327Lb, 327Rb mounted on the rear surface 305 of the case 300, and the front I/O adapter card bulkhead 311a, 311b mounted to the front surface 310 of the case 300.

Figure 15A:
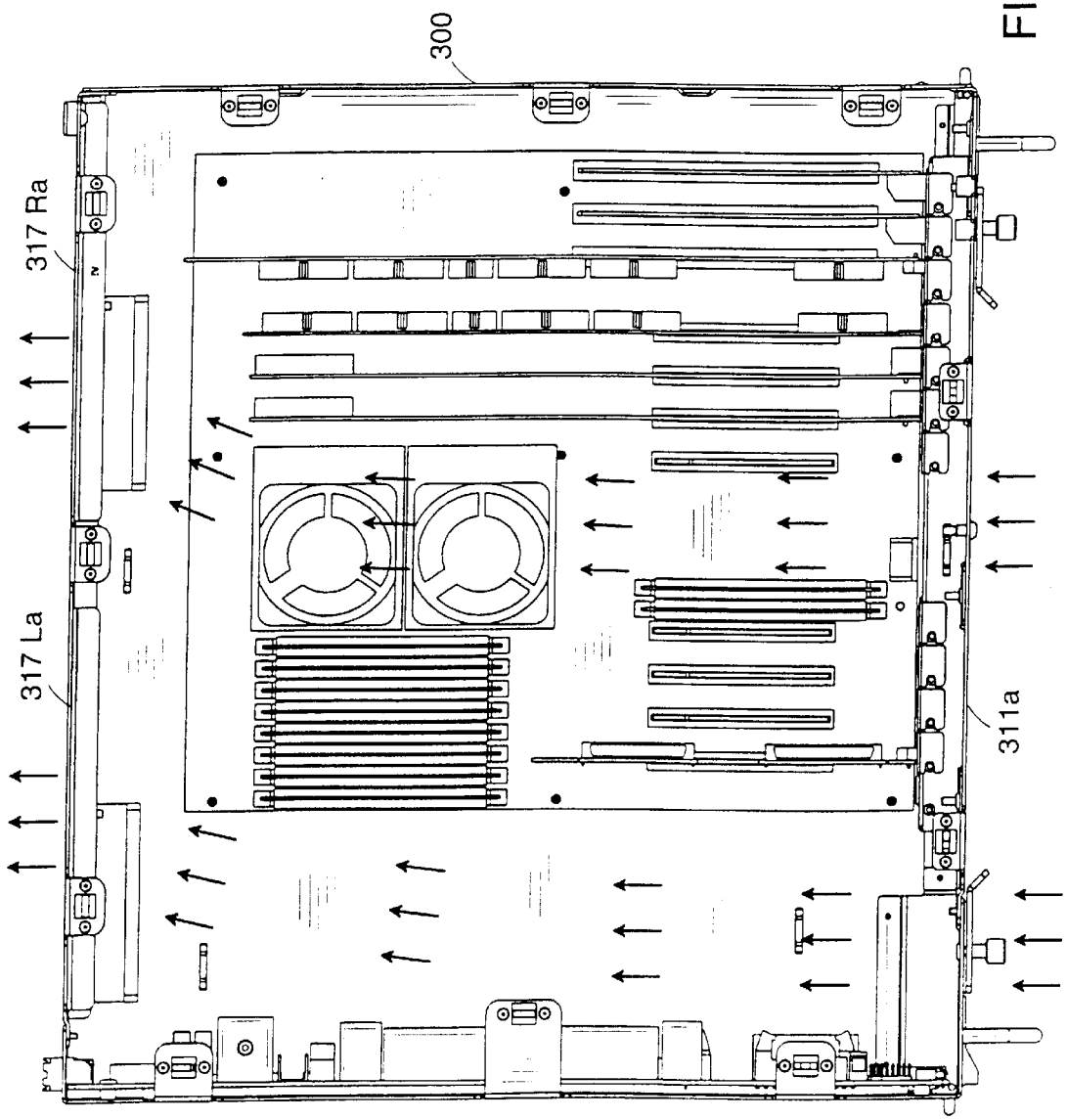
FIGS. 15A and 15B are top plan drawings of the cases of FIGS. 7A and 7B configured as the first type and second type of processing unit modules, respectively, such cases being shown with the cover therefor removed, such drawing illustrating air-flow through the cases.
Figure 15B:
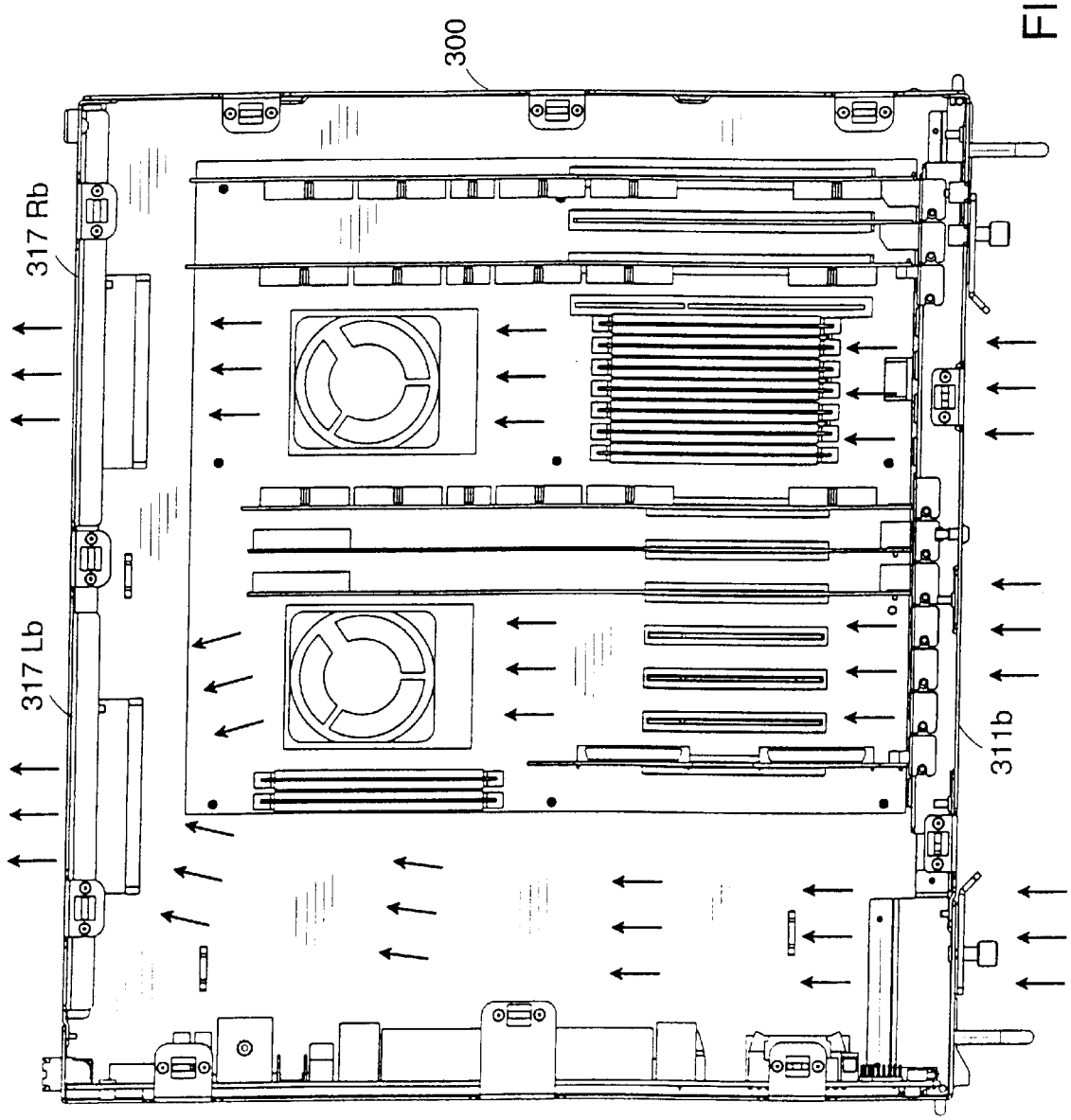

As described in the above-referenced patent application, the server interconnect printed circuit board 350 has mounted to it a DC to DC converter, a DC margin and thermal control unit module, a pair of control busses, a pair of Ethernet 10 Base2 busses, a parallel port interface and various indicators and switches accessible from the front panel of the processing unit module 28. The thermal control unit processing unit module 28 is used to control the fans 321 of the fan assemblies 327La, 327Ra and 327Lb, 327Rb, and hence the environment, of such processing unit module 28. Airflow through the data mover processing unit module 28 is from front to back, as shown in FIGS. 15A and 15B. The DC operated fans pull air from holes 354 in the front panel (and holes 354 in a honey-combed adapter card filler plate 356 (FIGS. 6A, 13A and 13B) described in the above-referenced patent application) of the processing unit module 28 and through the fans at the rear of the module 28 across the motherboard 302a or 302b depending on the motherboard configuration used in the case 300.

Figure 18A:
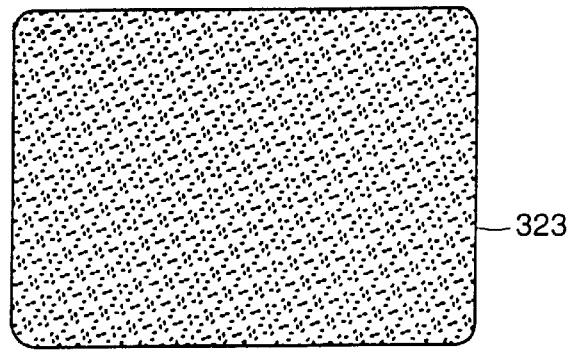
FIGS. 18A, 18B and 18C are top, side and perspective drawings, respectively, of the vibration damping pad shown in FIG. 17.
Figure 18B:
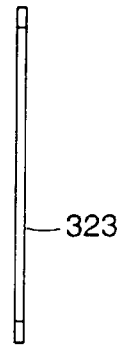
Figure 18C:
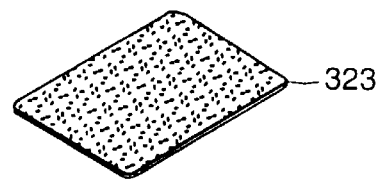
Figure 19:
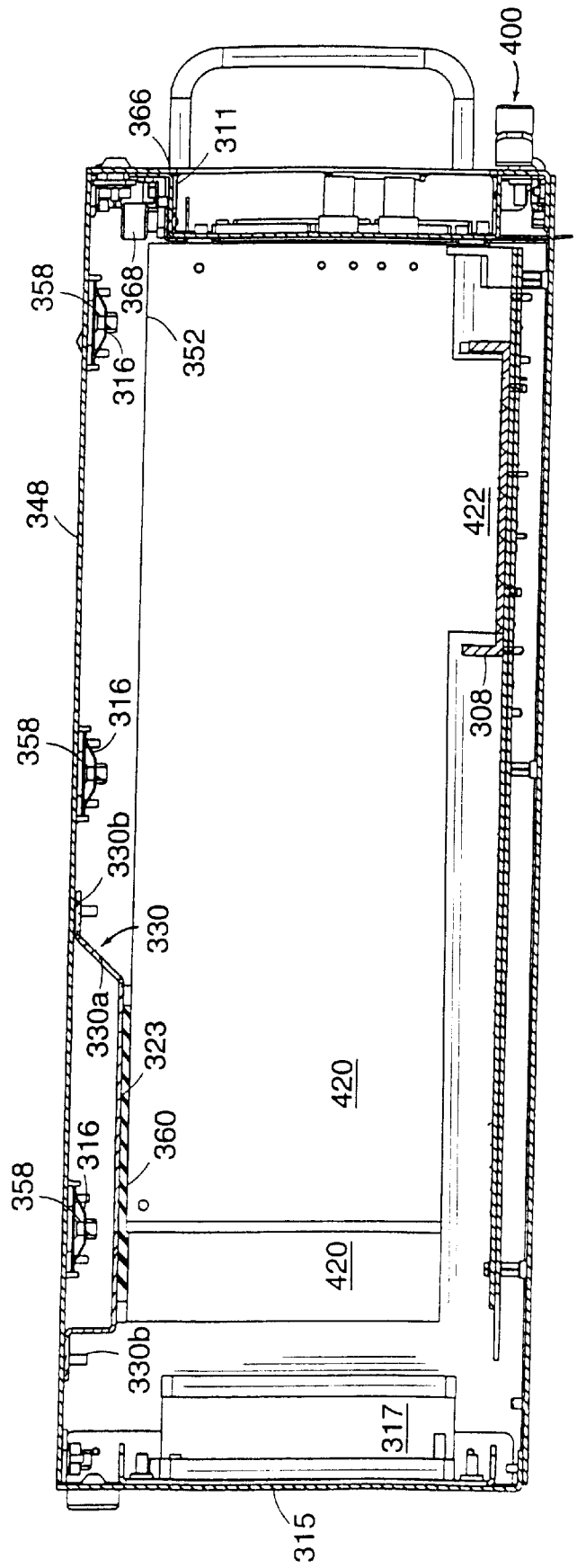
FIG. 19 is a cross-section side elevation view showing the engagement of vibration damping pad FIGS. 18A, 18B and 18C with I/O adapted cards plugged into a motherboard and having a front end affixed to the I/O adapter card bulkhead.

As noted above, the motherboards 302a, 302b have CPUs, main memory and a plurality of I/O adapter card slots 308 (FIGS. 8A and 8B). I/O adapter cards 420 (FIGS. 13A, 13B, 14A, 14B, 16) have front bottom edges 422 (FIG. 19) adapted for plugging into the I/O slots 308 of the motherboards (FIGS. 16 and 19). The cover 348 (FIGS. 16, 17 and 19) is adapted for mounting to the case 300 by screws 358 threading into brackets 316 as indicated in FIGS. 16 and 19. The cover 348 has an anti-vibration member 330 (FIGS. 16, 17 and 19). The member 330 has a bracket 330a which is riveted onto the cover 348 by rivets 330b. The bracket 330a protrudes inwardly in the case 300 when the cover 348 is affixed to the case 300 by mounting screws 358 which thread into the brackets 316, as indicated in FIGS. 16, 17 and 19). A resilient pad 323 (FIGS. 18A, 18B and 18C) is affixed to the mounting bracket 319 by a back-mounted adhesive. The pad 323 is adapted to engage a rear upper edge 360 of the plurality of I/O adapter cards 420 and maintain the I/O adapter cards 420 securely plugged into the motherboard slots 308 when the cover 348 is mounted (i.e, screwed) onto the case 300 by the screws 358, as indicated in FIG. 19. The I/O adapter cards 420 are therefore more securely retained plugged into the motherboard. It is noted that the cover 348 shown in FIGS. 16, 17, and 19 has the anti-vibration member 330 configured (i.e., sized and positioned) to engage the I/O adapter cards plugged into motherboard 302a (FIG. 8A), it being understood that if the anti-vibration member 330 of the cover 348 were to be used with motherboard 302b (FIG. 8B) the anti-vibration member 330 would have to be suitably configured to engage to I/O adapter cards plugged into the motherboard 302b.

More particularly, and considering an example where the anti-vibration member 330 is configured, as shown, for the motherboard 302a, each of the I/O adapter cards 420 is a convention adapter card having a front portion 352 mounting bracket 366 (FIGS. 13A and 19) affixed to it. The bracket 366 is secured to the front I/O bulkhead 311a (FIG. 11A) by individual screws 368 (FIG. 19) or by an I/O mounting plate described in detail in the above referenced patent application. The screws 368 are threaded into holes 500 (FIGS. 9A and 9B) in bulkhead 311a with the mounting bracket 366 wedged between the head of screw 368 and the bulkhead 311b as shown in FIG. 19. After the card 420 is plugged into slot 308, the bracket 366 is secured to the front panel 311b by the screw 368. When the cover 348 is fastened to the case 300 by screws 358 the pad 323 of the anti-vibration member 330 engages downwardly the rear upper edge 360 of the I/O adapter card 420. The pad 323 is a resilient, high density polyurethane soft foam with a 3M Company 950 pressure adhesive backing for affixing it to the metal bracket 319.

Other embodiments of the invention are within the spirit and scope of the appended claims.

What is claimed is:

1. A method for directing air-flow in a case, comprising:

(a) providing a case with an aperture formed through a panel thereof, such case being adapted to have mounted therein one of a plurality of motherboards, each one of the plurality of motherboards having a different configuration of electrical components mounted thereto;

(b) selecting one of the plurality of motherboards;

(c) providing a plurality of mounting plates, each of the plurality of mounting plates having an air-flow aperture formed therethrough in a different position on the mounting plate;

(d) selecting one of the plurality of mounting plates in accordance with: (1) the configuration of the electrical components of the selected one of the motherboards; and, (2) the position of the air-flow aperture;

(e) mounting the selected one of the plurality of mounting plates in registration with the aperture in said case; and, (f) providing a fan mounted in registration with the air-flow aperture of the selected one of the plurality of mounting plates.

2. A method for directing air-flow through a case, comprising:

(a) providing a case with an aperture formed through a panel of the case, such case being adapted to have mounted therein one of a plurality of motherboards, each one of the plurality of motherboards having a different configuration of electrical components mounted thereto;

(b) selecting one of the plurality of motherboards;

(c) providing a plurality of fan assemblies;

(d) selecting one of the plurality of fan assemblies in accordance with: (1) the configuration of the electrical components of the selected one of the motherboards; and, (2) the position of the air-flow aperture; and, (e) mounting the selected one of the plurality of fan assemblies in registration with the aperture in said case.

* * * * *